United States Patent
Ishihara et al.

(10) Patent No.: US 9,698,327 B2
(45) Date of Patent: Jul. 4, 2017

(54) LED ILLUMINATION MODULE AND LED ILLUMINATION APPARATUS

(71) Applicant: SHIKOKU INSTRUMENTATION CO., LTD., Nakatado-gun, Kagawa (JP)

(72) Inventors: Masamichi Ishihara, Kitakyushu (JP); Kenshu Oyama, Ogori (JP); Shoji Murakami, Nakatado-gun (JP); Hitonobu Onosaka, Nakatado-gun (JP); Masato Shima, Nakatado-gun (JP)

(73) Assignee: SHIKOKU INSTRUMENTATION CO., LTD., Kagawa (JP)

( * ) Notice: Subject to any disclaimer, the term of this patent is extended or adjusted under 35 U.S.C. 154(b) by 37 days.

(21) Appl. No.: 14/406,109

(22) PCT Filed: Jun. 6, 2013

(86) PCT No.: PCT/JP2013/065645
§ 371 (c)(1),
(2) Date: Dec. 5, 2014

(87) PCT Pub. No.: WO2013/183693
PCT Pub. Date: Dec. 12, 2013

(65) Prior Publication Data
US 2015/0155459 A1     Jun. 4, 2015

(30) Foreign Application Priority Data
Jun. 7, 2012   (JP) ................... 2012-129643

(51) Int. Cl.
*H01L 33/00* (2010.01)
*H01L 33/60* (2010.01)
(Continued)

(52) U.S. Cl.
CPC ............ *H01L 33/62* (2013.01); *F21V 7/0066* (2013.01); *F21V 23/023* (2013.01); *F21V 29/70* (2015.01);
(Continued)

(58) Field of Classification Search
CPC . F21V 7/0066; F21Y 2101/02; H05K 1/0274; H05K 2201/10106;
(Continued)

(56) References Cited

U.S. PATENT DOCUMENTS

| 8,833,982 B2* | 9/2014 | Funakubo | F21V 21/00 313/46 |
| 2006/0022214 A1* | 2/2006 | Morgan | F21K 9/00 257/99 |

(Continued)

FOREIGN PATENT DOCUMENTS

| EP | 2 416 389 A1 | 2/2012 |
| JP | 2007-201171 A | 8/2007 |

(Continued)

OTHER PUBLICATIONS

International Search Report dated Jul. 2, 2013, issued in corresponding International Application No. PCT/ JP2013/065645. (2 Pages).

(Continued)

*Primary Examiner* — Peggy Neils
(74) *Attorney, Agent, or Firm* — Westerman, Hattori, Daniels & Adrian, LLP

(57) ABSTRACT

An LED illumination module in which LED bare chips are mounted on a mounting substrate at a high density, the module comprising many LED bare chips having the same specifications, the mounting substrate at least a surface of which is metal, and a reflection region in which the LED bare chips are sealed off with resin, wherein a surface of the reflection region of the mounting substrate is covered with
(Continued)

an inorganic white insulating layer that functions as a reflection member, a unit LED chip group including a plurality of LED bare chips connected in series is disposed plural, the plural unit LED chip groups being connected in parallel, overall light flux is 10,000 lumens or more, and a mounting area density of the LED bare chips in the reflection region is 15 mm$^2$/cm$^2$ or more. An LED illumination apparatus including the LED illumination module is also provided.

22 Claims, 16 Drawing Sheets

(51) Int. Cl.

| | | |
|---|---|---|
| H01L 33/62 | (2010.01) | |
| H01L 25/075 | (2006.01) | |
| F21V 29/70 | (2015.01) | |
| F21V 7/00 | (2006.01) | |
| F21V 23/02 | (2006.01) | |
| H01L 27/15 | (2006.01) | |
| H01L 33/64 | (2010.01) | |
| H05K 1/02 | (2006.01) | |

(52) U.S. Cl.
CPC ........ *H01L 25/0753* (2013.01); *H01L 27/156* (2013.01); *H01L 33/60* (2013.01); *H01L 33/641* (2013.01); *H01L 33/642* (2013.01); *H01L 33/644* (2013.01); *H01L 2224/45139* (2013.01); *H01L 2224/45144* (2013.01); *H01L 2224/48091* (2013.01); *H01L 2224/48137* (2013.01); *H01L 2924/181* (2013.01); *H05K 1/0274* (2013.01); *H05K 2201/10106* (2013.01); *H05K 2201/2054* (2013.01)

(58) Field of Classification Search
CPC ...... H05K 2201/2054; H01L 2924/181; H01L 2224/48137; H01L 25/0753; H01L 27/156; H01L 33/60; H01L 33/62; H01L 33/641
See application file for complete search history.

(56) References Cited

U.S. PATENT DOCUMENTS

| | | | |
|---|---|---|---|
| 2006/0220030 A1 | 10/2006 | Tain et al. | |
| 2009/0050907 A1 | 2/2009 | Yuan et al. | |
| 2011/0101389 A1* | 5/2011 | Wu | F21K 9/00 257/91 |
| 2011/0133236 A1* | 6/2011 | Nozaki | H01L 33/642 257/98 |
| 2011/0175536 A1* | 7/2011 | Fujita | F21S 8/02 315/185 R |
| 2012/0002420 A1* | 1/2012 | Imai | H01L 33/486 362/249.02 |
| 2012/0014110 A1* | 1/2012 | Sanpei | F21K 9/00 362/296.04 |
| 2012/0074445 A1 | 3/2012 | Shimonishi et al. | |
| 2012/0091495 A1* | 4/2012 | Hatanaka | H01L 33/60 257/98 |
| 2012/0113650 A1* | 5/2012 | Inoue | C04B 41/5022 362/296.02 |
| 2012/0146066 A1* | 6/2012 | Tischler | H01L 27/156 257/89 |
| 2012/0299022 A1* | 11/2012 | Hussell | H01L 25/0753 257/88 |
| 2013/0094204 A1* | 4/2013 | Budai | F21V 33/00 362/230 |
| 2013/0181601 A1* | 7/2013 | Chung | H01L 25/0753 313/503 |
| 2014/0313716 A1* | 10/2014 | Lang | H01L 35/30 362/235 |

FOREIGN PATENT DOCUMENTS

| | | |
|---|---|---|
| JP | 2009-289810 A | 12/2009 |
| JP | 2011-9298 A | 1/2011 |
| JP | 2012-059921 A | 3/2012 |
| JP | 2012-74483 A | 4/2012 |
| WO | 2012/002580 A1 | 1/2012 |

OTHER PUBLICATIONS

Supplementary European Search Report dated Jan. 8, 2016, issued in counterpart European Patent Application No. 13 80 0218. (2 pages).

* cited by examiner

[Fig. 1]
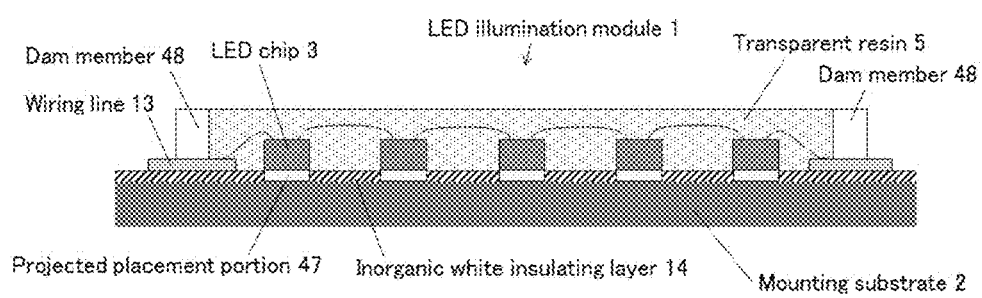
[Fig. 2]
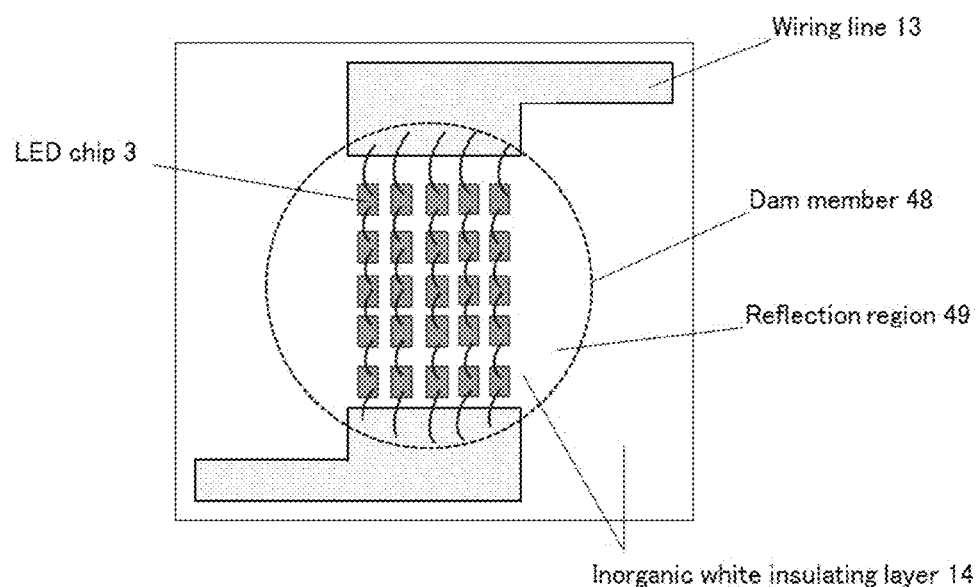

[Fig. 5]
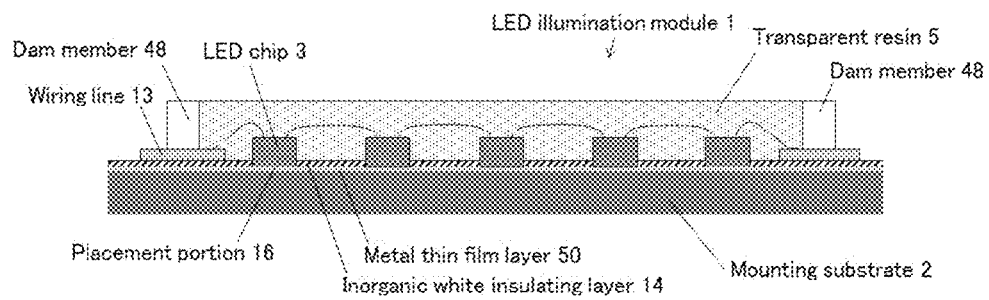
[Fig. 6]
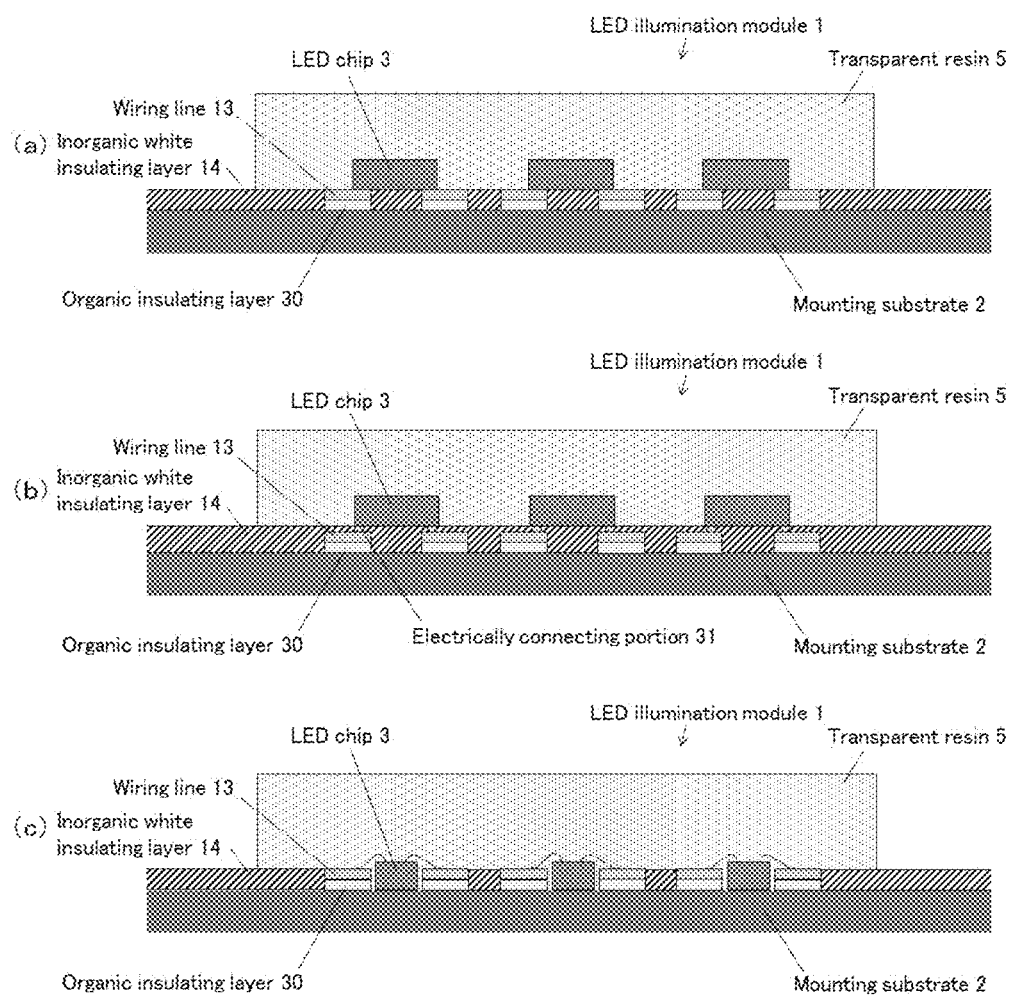

[Fig. 7]
STEP 1 Form organic insulating layer and copper foil layer on substrate
STEP 2 Patterning of copper foil
STEP 3 Remove organic insulating layer with copper foil used as mask (etching)
STEP 4 Apply white inorganic material
(a) Substantially at same level as wiring line
(b) Partly covering wiring line
[Fig. 8]
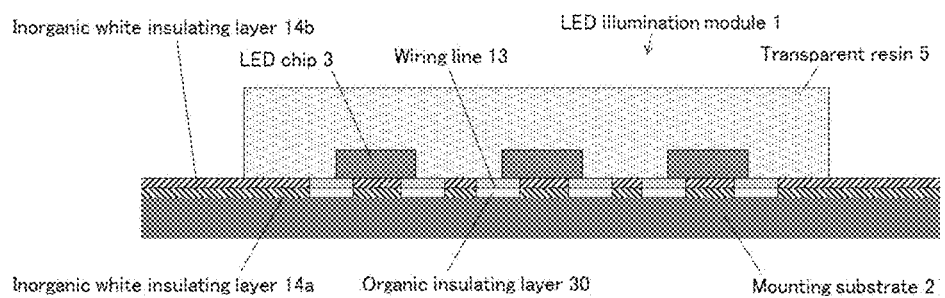

[Fig. 9]
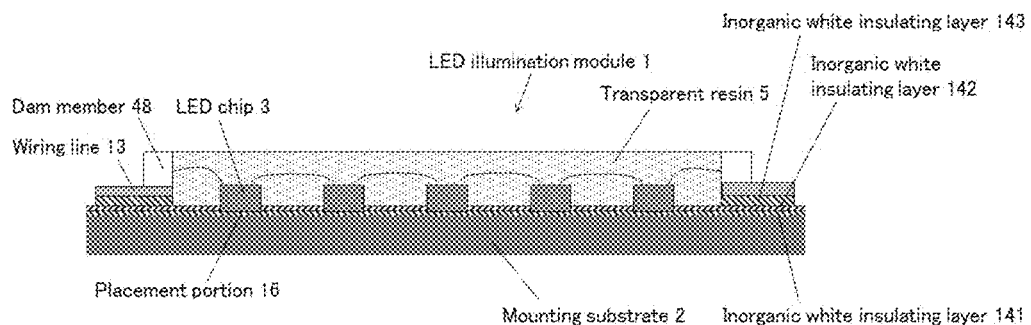
[Fig. 10]
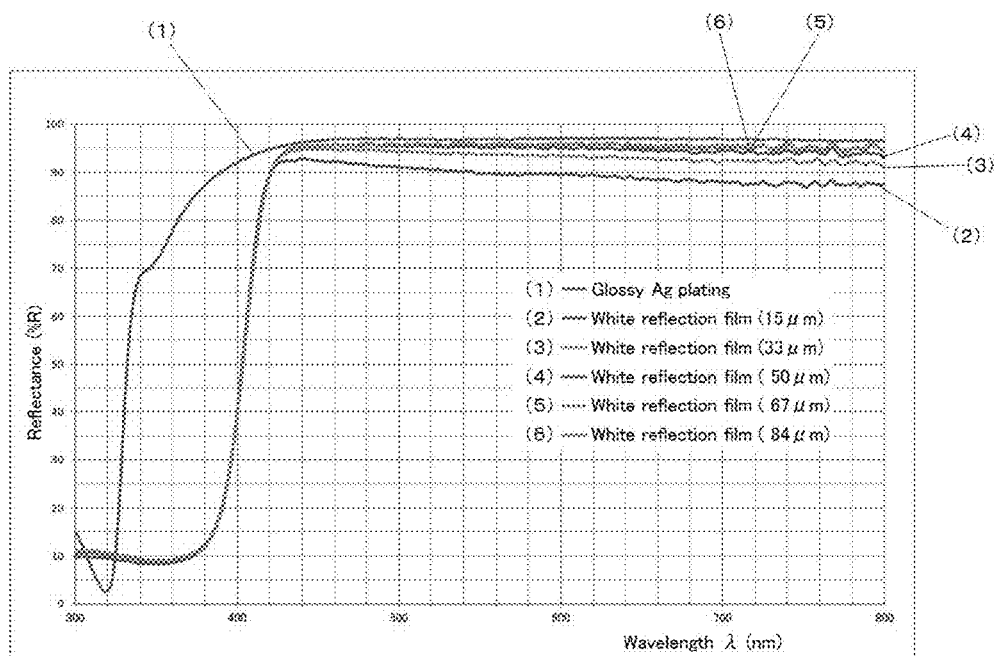

[Fig. 11]
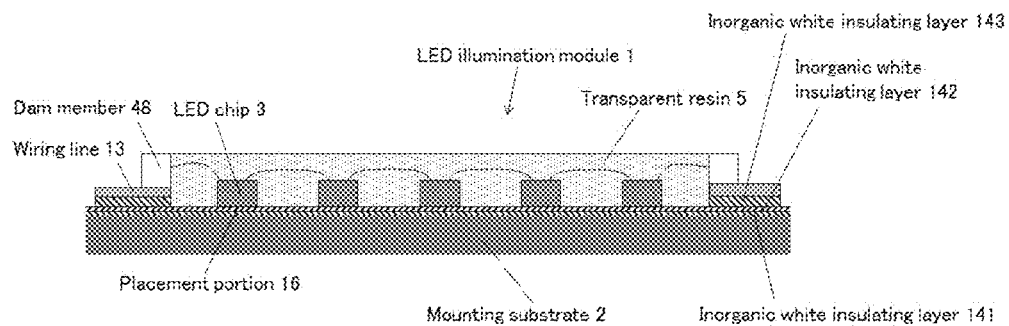
[Fig. 12]
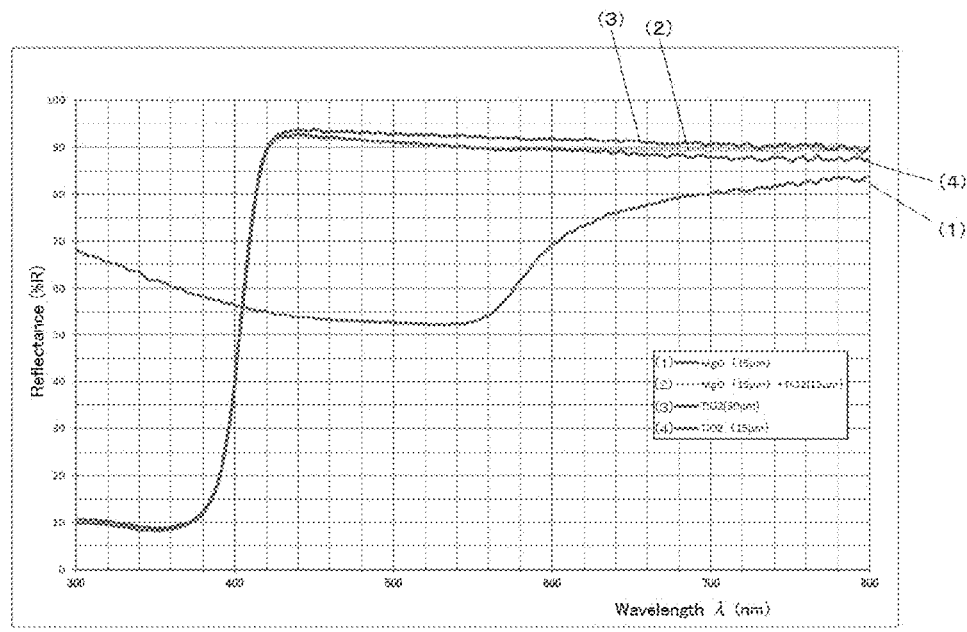

[Fig. 13]
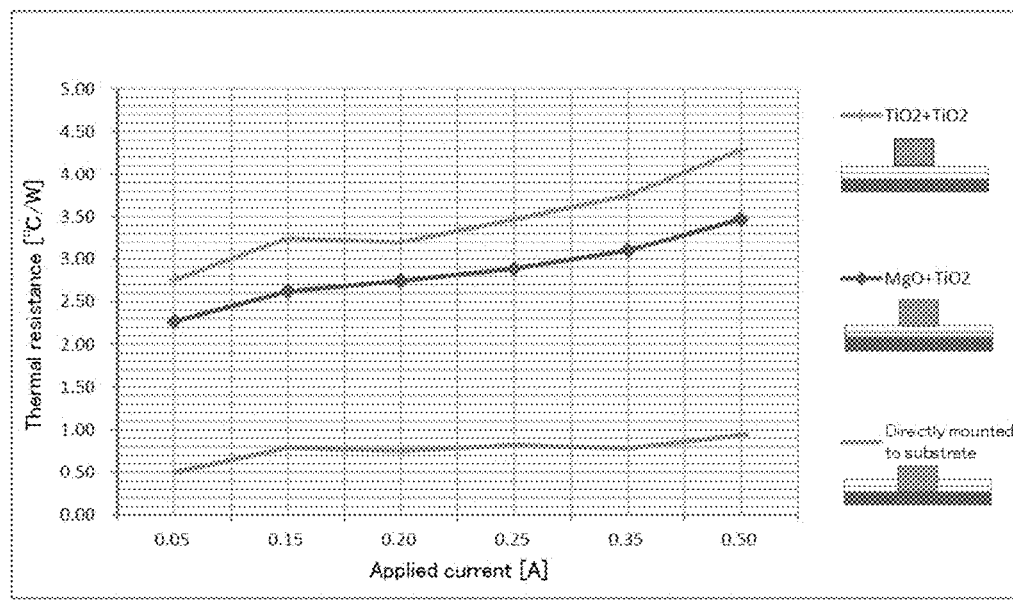
[Fig. 14]
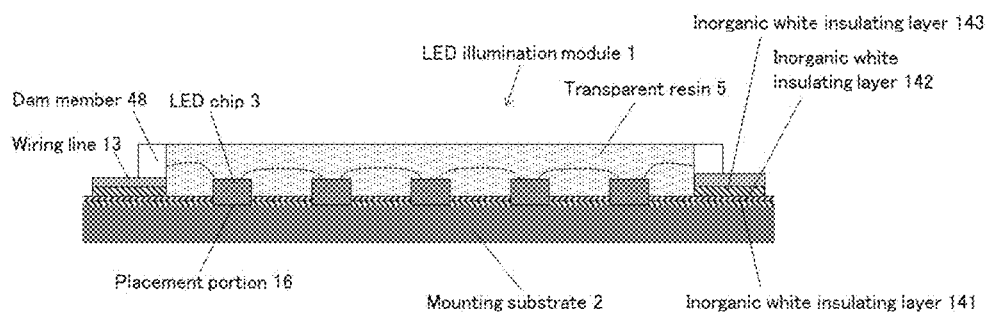

[Fig. 15]
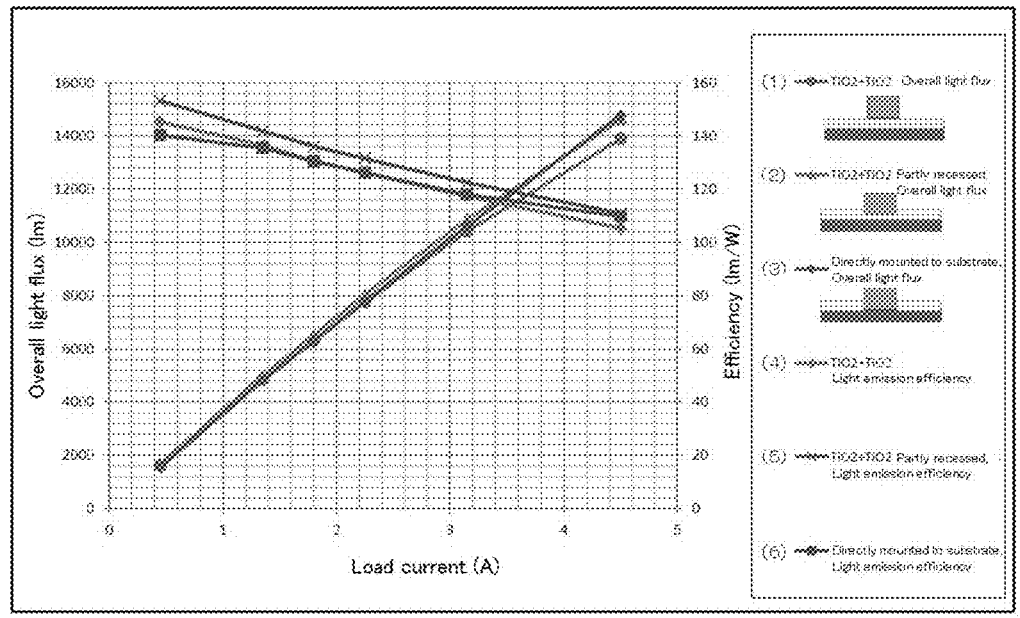
[Fig. 16]
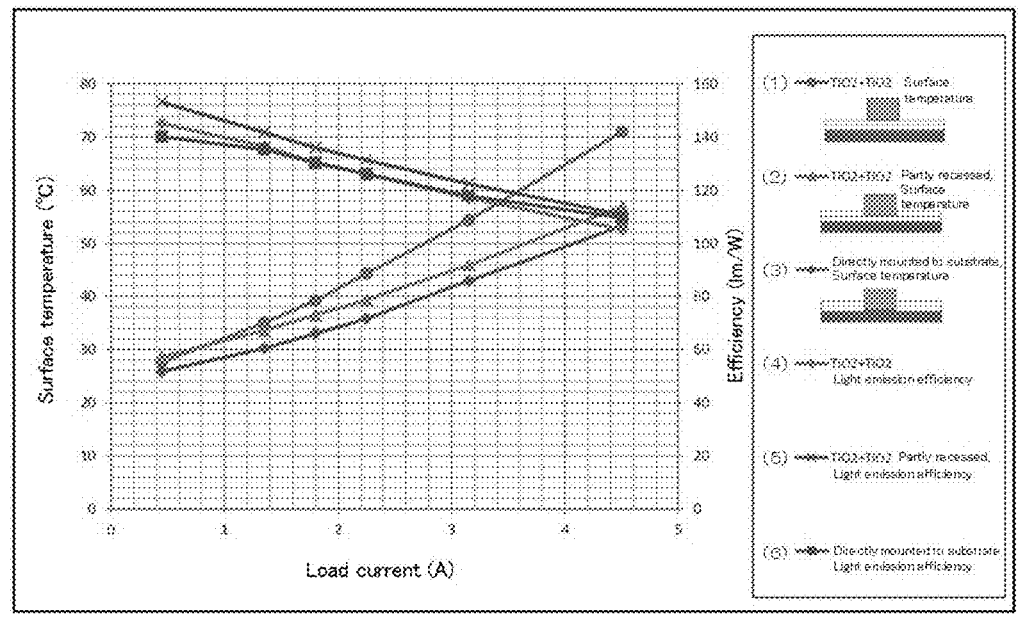

[Fig. 19]
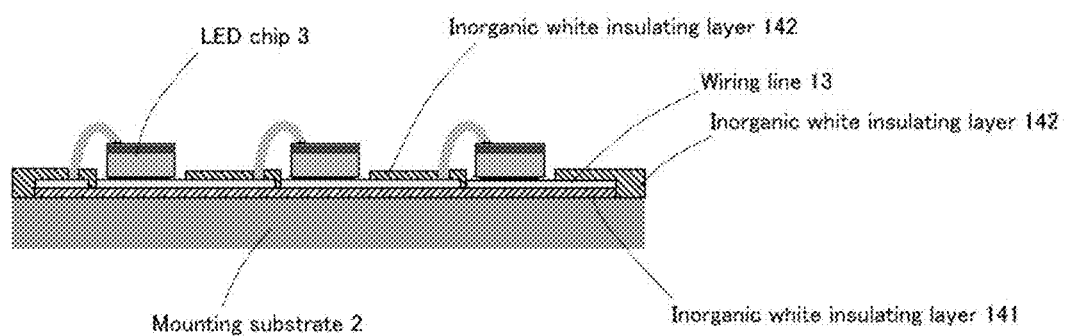

[Fig. 20]
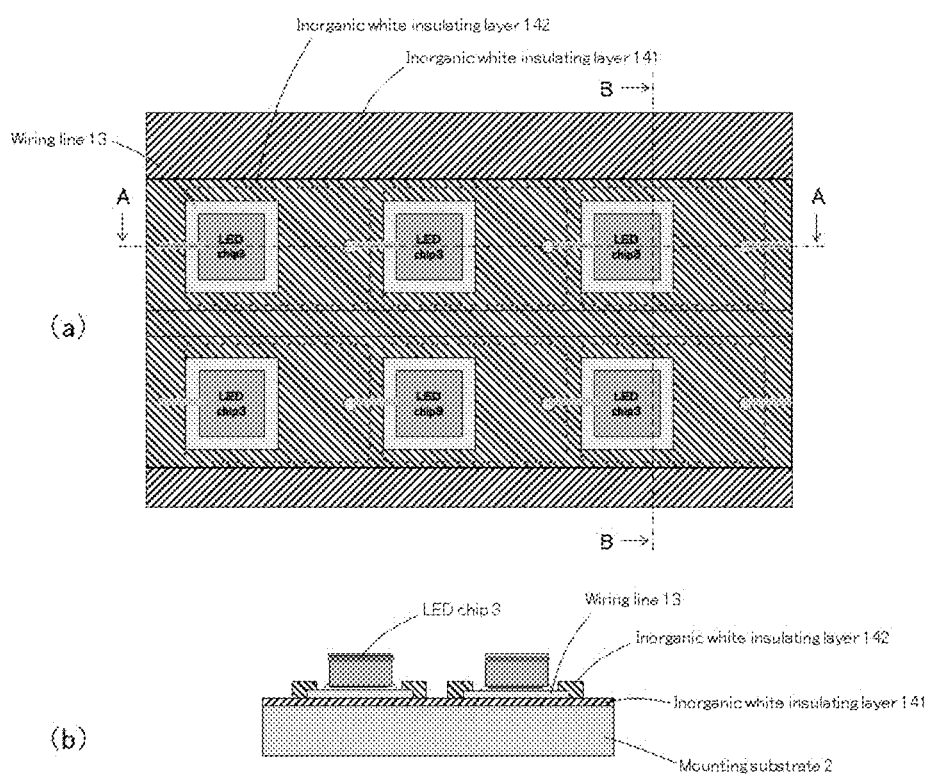

[Fig. 21]
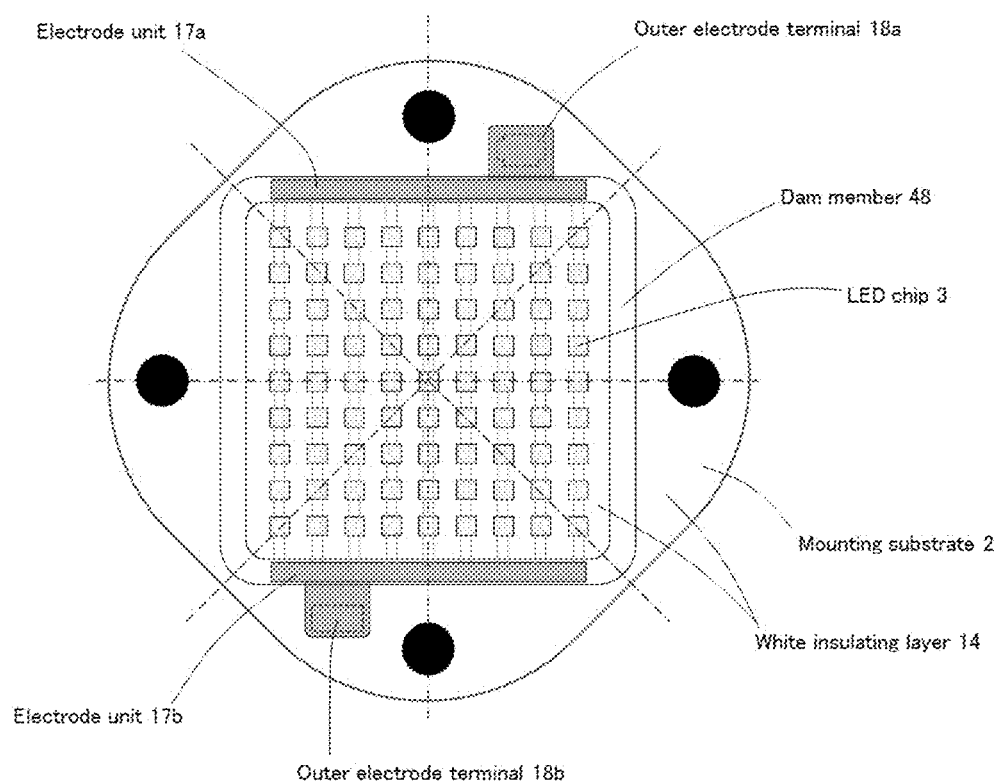

[Fig. 22]
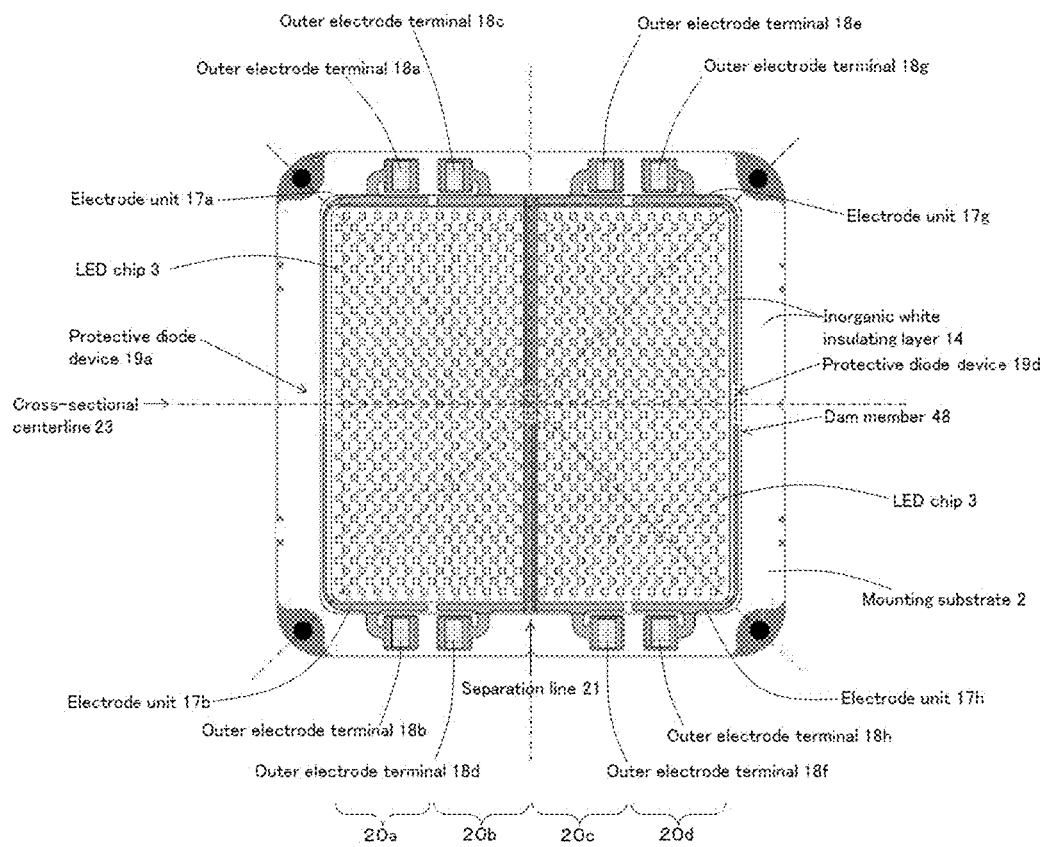

[Fig. 23]
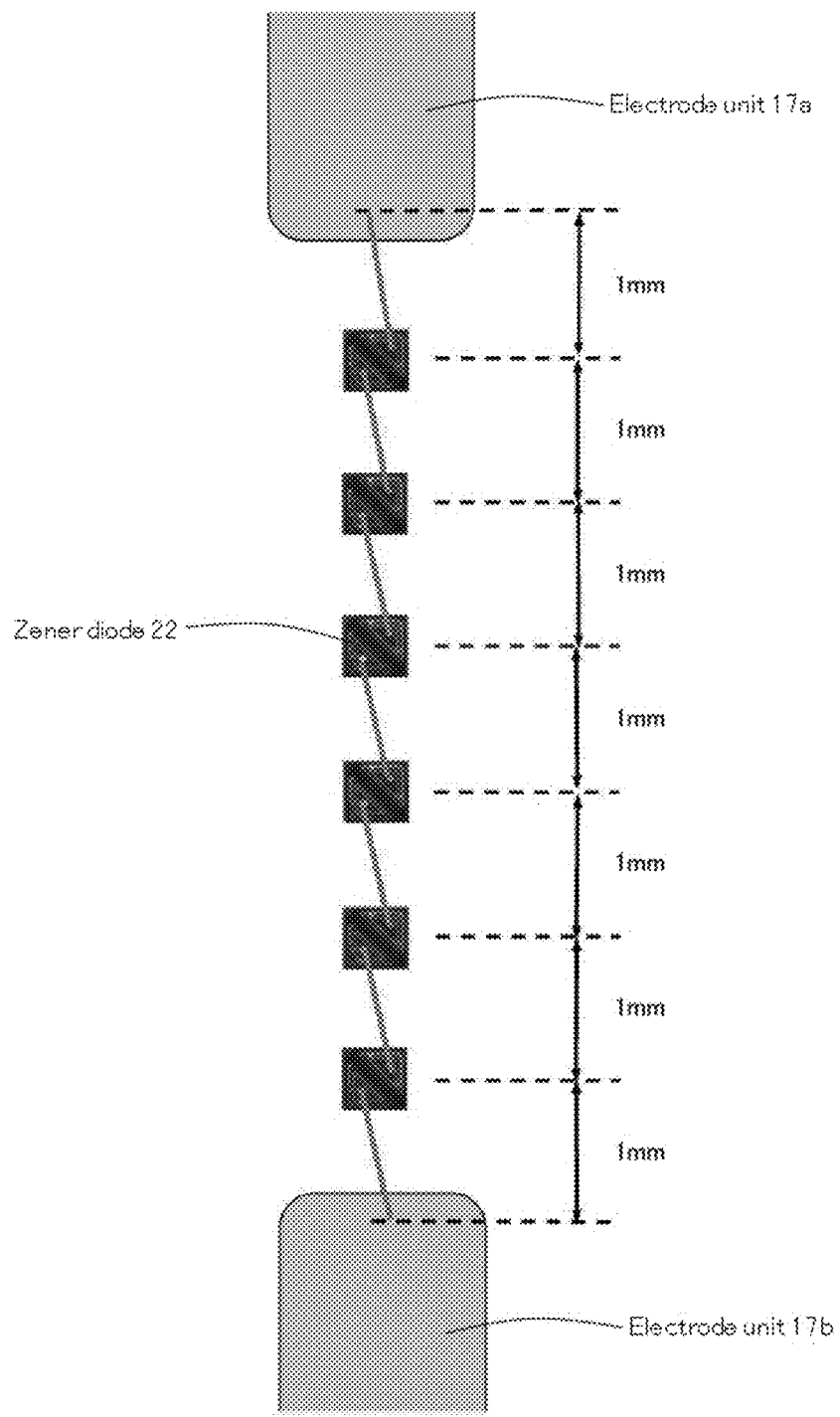

LED ILLUMINATION MODULE AND LED ILLUMINATION APPARATUS

TECHNICAL FIELD

The present invention relates to an LED illumination module and an LED illumination apparatus of a COB (Chip On Board) structure, and more particularly to an LED illumination module and an LED illumination apparatus, which emits a great amount of light at overall light flux of, e.g., 30,000 to 150,000 lumens (Inn).

BACKGROUND ART

Recently, many illumination appliances have been proposed in which LED (Light Emitting Diodes) are employed as light emitting units. As LED mounting methods, there are known COB mounting and package mounting. The COB mounting is practiced, for example, by mounting a semiconductor element to a flat-plate substrate on a surface of which a pattern of lead electrodes is formed using a metal film, electrically connecting the semiconductor element to the lead electrodes, and sealing the semiconductor element with resin.

An LED light emitting device of COB structure is manufactured by electrically connecting an LED element, mounted on a mounting substrate, to wiring lines on the mounting substrate by wire bonding or flip chip mounting, and sealing an LED-element mounted region with light transmissive resin. There is known a manufacturing method of, before resin sealing, disposing an annular frame around a mounting region on the substrate, and filling the light transmissive resin inside the frame for sealing (see, e.g., Patent Document 1).

Hitherto, thermosetting resin made of an organic material and added with inorganic white pigment has been proposed as a composition that can form a solder resist film with a high reflectance (see, e.g., Patent Document 2). The inorganic white pigment has a particle size of, e.g., 0.3 µm or less. However, a liquid material containing the pigment having such a particle size cannot be applied by ink jetting, a dispenser or a spray coater, and it has to be applied by screen printing. Furthermore, heat dissipation performance of an organic material is generally about 0.3 w/m·k and is inferior to that of an inorganic material (e.g. about 1.5 w/m·k of silicon dioxide ($SiO_2$), about 8 w/m·k of titanium dioxide, and about 50 w/m·k of zinc oxide). A wiring substrate using an insulating layer made of an organic material has other problems with heat endurance, deterioration caused by ultraviolet rays, and deterioration attributable to long-term use (i.e., durability).

Of late, a heat pipe (heat spreader) for cooling a heat generating body through evaporation and condensation of a sealed-in coolant has been proposed, and it can be mounted into even a small space. Patent Document 3 proposes a heat pipe including a cooling main body in which a placement portion for arrangement of a device to be cooled is provided in one of an upper plate and a lower plate with one or a plurality of intermediate plates disposed between the upper plate and the lower plate, the cooling main body includes therein a vapor diffusion passage for transferring heat, generated in the device to be cooled upon conversion of the coolant to vapor, to peripheral portions of the cooling main body, and capillary passages disposed in the intermediate plate and constituted to return the coolant condensed in the peripheral portions toward the placement portion, and the placement portion has a recess, which is formed thinner than the other region and in which the device to be cooled is mounted.

LIST OF PRIOR-ART DOCUMENTS

Patent Documents

Patent Document 1: Japanese Patent Laid-Open Publication No. 2009-164157
Patent Document 2: Japanese Patent Laid-Open Publication No. 2009-4718
Patent Document 3: Japanese Patent No. 4119944

SUMMARY OF THE INVENTION

Problems to be Solved by the Invention

A problem to be solved by the present invention is to provide an LED illumination apparatus that has high brightness and emits a great amount of light, and that is compact and lightweight. To realize such an LED illumination apparatus, it is presumably required to use an LED chip with a maximum rated current of at least 100 mA or more. This may cause a problem with deterioration of components attributable to an increase in amount of generated heat.

Moreover, an LED light emitting device generally has the problem that because an electrical insulating layer positioned at a lower surface of a semiconductor chip is made of an organic material as a main ingredient and has poor thermal conductivity, good heat dissipation characteristics are not obtained. The organic material has restrictions in heat endurance, durability, etc., and is susceptible to discoloration. From that point of view, another problem to be solved by the present invention is to constitute an electrical insulating layer such that at least an uppermost layer of a reflection region is made of an inorganic material.

Means for Solving the Problems

White inorganic pigment has so far been used as a liquid material mixed into an organic material. Because that type of liquid material cannot be applied by an ink jet method or a dispenser method, it has been applied only by screen printing.

The inventors have found that, by employing mixed ink containing white inorganic pigment and silicon dioxide ($SiO_2$) in the form of nanoparticles, a white inorganic insulating material can be used as ink adapted for an ink jet method, a dispenser method, or a spray coating method, and that it can be applied to form a desired pattern and to cover an irregular surface. Furthermore, because of using nano-sized particles, the ink can be applied in a way of spreading to follow small irregularities in a substrate of an application target, e.g., a copper plate, thereby greatly increasing adhesion. Thus, a multilayer structure of an inorganic white insulating layer and a metal layer can be formed.

Moreover, by utilizing the inorganic white insulating layer superior in heat endurance, durability, and heat dissipation performance, the inventors have succeeded in practicing an LED illumination apparatus, which has high brightness and emits a great amount of light, and which has solved the problem attributable to heat generated when LED chips are mounted at a high density. More specifically, the present invention is constituted by the following technical means.

[1] An LED illumination module in which LED bare chips are mounted on a mounting substrate at a high density, the module comprising many LED bare chips having same specifications, the mounting substrate at least a surface of which is metal, and a reflection region in which the LED bare chips are sealed off with resin, wherein a surface of the reflection region of the mounting substrate is covered with an inorganic white insulating layer that functions as a reflection member, a unit LED chip group including a plurality of LED bare chips connected in series is disposed plural, the plural unit LED chip groups being connected in parallel, overall light flux is 10,000 lumens or more, and a mounting area density of the LED bare chips in the reflection region is 15 $mm^2/cm^2$ or more.

[2] The LED illumination module according to [1], wherein the inorganic white insulating layer includes an inorganic white insulating layer that is formed by applying a liquid material, which contains white inorganic pigment and $SiO_2$ in form of nanoparticles, to the surface of the mounting substrate, and baking the applied liquid material, and at least a part of the relevant inorganic white insulating layer constitutes a multilayer structure in combination with a metal layer.

[3] The LED illumination module according to [1] or [2], wherein the surface of the mounting substrate is copper. The term "mounting substrate" used here involves a heat spreader (multilayer structured body constituted by three types of copper plates, i.e., an upper plate, an intermediate plate, and a lower plate), which has a surface made of copper and a water cooling structure, for example.

[4] The LED illumination module according to any one of [1] to [3], wherein the module includes a plurality of mounting blocks in which the many LED bare chips are mounted in equally divided number, and each of the mounting blocks includes a plurality of unit LED chip groups, and a pair of electrode units to which the plural unit LED chip groups are connected in parallel.

[5] The LED illumination module according to [4], wherein each of the mounting blocks includes a protective diode that connects the pair of electrode units.

[6] The LED illumination module according to [5], wherein the plural mounting blocks are constituted by an even number of mounting blocks made up of paired mounting blocks that are arranged in line symmetrical relation.

[7] The LED illumination module according to [6], wherein the plural mounting blocks are three or more mounting blocks, and a separation line is disposed between the mounting blocks adjacent to each other.

[8] The LED illumination module according to any one of [1] to [3], wherein the unit LED chip group includes a number n (n is an integer of 8 or more) of LED bare chips, and the many LED bare chips are arranged in an array of n rows×n columns.

[9] The LED illumination module according to any one of [1] to [8], wherein the many LED bare chips are a number 300 or more of LED bare chips, and overall light flux is 30,000 lumens or more.

[10] The LED illumination module according to [9], wherein the LED bare chips are each a LED bare chip in class having a maximum rated current of 100 mA or more and several watts, and total load electric power is several hundreds watts (W) or more.

[11] The LED illumination module according to [9] or [10], wherein brightness in the reflection region is 7.0 [$lm/mm^2$] or more.

[12] The LED illumination module according to [9], [10] or [11], wherein an area of the mounting substrate is 5,000 $mm^2$ or more and 20,000 $mm^2$ or less.

[13] The LED illumination module according to any one of [1] to [12], wherein a placement portion in which the metal surface is exposed is formed at a position where the LED bare chip is placed.

[14] The LED illumination module according to any one of [1] to [13], wherein the inorganic white insulating layer includes a first inorganic white insulating layer laminated on the mounting substrate, and a second inorganic white insulating layer laminated on the first inorganic white insulating layer.

[15] The LED illumination module according to [14], wherein white inorganic pigment contained in the first inorganic white insulating layer has a higher thermal conductivity than white inorganic pigment contained in the second inorganic white insulating layer.

[16] The LED illumination module according to [15], wherein a recessed LED placement portion in which the second inorganic white insulating layer is exposed is formed in the first inorganic white insulating layer.

[17] The LED illumination module according to any one of [1] to [12] further comprises an organic insulating layer that constitutes a layer positioned under the inorganic white insulating layer.

[18] The LED illumination module according to any one of [1] to [12] further comprises an organic insulating layer that covers a surface of a region of the mounting substrate outside the reflection region.

[19] An LED illumination apparatus comprising the LED illumination module according to any one of [1] to [18], a reflector, a heat spreader, a heat sink, and a power supply device.

[20] An LED illumination apparatus comprising the LED illumination module according to [4], a reflector, a heat spreader, a heat sink, and a plurality of power supply devices, wherein the number of power supply devices and the number of mounting blocks are equal.

[21] The LED illumination apparatus according to [19] or [20], wherein weight of the LED illumination apparatus except for the power supply devices is 15 kg or less.

From another viewpoint, the present invention is constituted by the following technical means.

A first invention relates to a semiconductor device comprising a first substrate on which semiconductor chips are mounted directly or indirectly, and a white insulating layer formed on a surface of the first substrate and functioning as a reflection member, wherein the semiconductor chips are LED chips, at least a surface of the first substrate is metal, and a multilayer structure of the white insulating layer and a metal layer is formed by applying a liquid material, which contains white inorganic pigment and $SiO_2$ in form of nanoparticles, to the surface of the first substrate, and baking the applied liquid material. The term "first substrate" used here involves a module substrate on which a semiconductor package including a semiconductor chip is mounted, and a package substrate on which a semiconductor chip is mounted directly. In the first substrate, it is just required that at least the surface thereof is made of metal. Therefore, the first substrate involves a module substrate that is provided as, e.g., a substrate having a metal thin film layer formed on its upper surface, a substrate having a water cooling structure (see Patent Document 3), or a substrate including a heat dissipation member, which has a water cooling structure and which is stacked on the substrate. The first substrate further involves a package substrate in which a wiring layer is formed on an upper surface of an organic insulating layer.

A second invention relates to a semiconductor device comprising a first substrate on which semiconductor chips are mounted directly or indirectly, and a white insulating layer formed on a surface of the first substrate, wherein at least a surface of the first substrate is metal, and a multilayer structure of the white insulating layer and a metal layer is formed by applying a liquid material, which contains white inorganic pigment and $SiO_2$ in form of nanoparticles, to the surface of the first substrate, and baking the applied liquid material.

According to a third invention, in the first or second invention, a rate of the $SiO_2$ and the white inorganic pigment contained in the white insulating layer after the baking is 80 weight % or more.

According to a fourth invention, in the third invention, a rate of the $SiO_2$ and the white inorganic pigment contained in the white insulating layer after the baking is 40 weight % or more, and a rate of the $SiO_2$ is 25 weight % or more. For example, the white inorganic pigment is titanium dioxide having an average particle diameter of 50 nm or less, and contains titanium dioxide having a particle diameter of 25 nm or less.

According to a fifth invention, in any one of the first to fourth inventions, the white inorganic pigment is in form of particles of titanium dioxide or zinc oxide, the particles having surfaces coated with transparent insulating films.

According to a sixth invention, in any one of the first to fifth inventions, the white insulating layer is of a multilayer structure made up of a first layer containing zinc oxide as the white inorganic pigment and a second layer containing titanium dioxide as the white inorganic pigment, and particles of the titanium dioxide constituting the first layer are coated with transparent insulating films.

According to a seventh invention, in any one of the first to sixth inventions, the first substrate is a module substrate on which a semiconductor package including a semiconductor chip is mounted, and a wiring pattern connected to electrodes of the semiconductor package is formed on the white insulating layer.

According to an eighth invention, in any one of the first to sixth inventions, the first substrate is a module substrate on which a plurality of semiconductor chips is mounted, and a wiring layer connected to electrodes of the semiconductor chips is formed on an insulating layer that is formed on a surface of the first substrate.

According to a ninth invention, in the sixth invention, the insulating layer positioned under the wiring layer is an organic insulating layer.

According to a tenth invention, in the seventh invention, at least a part of a surface of the wiring layer is covered with the white insulating layer.

According to an eleventh invention, in the eighth invention, the insulating layer positioned under the wiring layer is the white insulating layer.

According to a twelfth invention, in any one of the eighth to eleventh inventions, a placement portion in which the metal surface is exposed is formed at a position where the semiconductor chip is arranged.

According to a thirteenth invention, in the twelfth invention, the placement portion is a projected placement portion.

According to a fourteenth invention, in any one of the eighth to thirteenth inventions, the plural semiconductor chips are each connected to the adjacent semiconductor chip by wire bonding.

According to a fifteenth invention, in any one of the seventh to fourteenth inventions, a transparent solder resist layer made of an inorganic material is formed on the first substrate.

According to a sixteenth invention, in any one of the first to sixth inventions, the first substrate is a package substrate having a recess in one or a plurality of semiconductor chips is arranged and the white insulating layer is formed, and the semiconductor device further comprises a second substrate having an opening into which the first substrate is fitted.

According to a seventeenth invention, in the sixteenth invention, a wiring layer connected to electrodes of the semiconductor chip is formed on an organic insulating layer that is formed on a base member surface of the first substrate, and at least a part of a surface of the wiring layer is covered with the white insulating layer.

According to an eighteenth invention, in the sixteenth or seventeenth invention, the placement portion in which the metal surface is exposed is formed at a position in the recess of the first substrate where the semiconductor chip is arranged.

According to a nineteenth invention, in the sixteenth, seventeenth, or eighteenth invention, the semiconductor device further includes a heat dissipation plate that is contacted with rear surfaces of the first and second substrates.

According to a twentieth invention, in any one of the first to sixth inventions, the first substrate is a package substrate on which one or a plurality of semiconductor chips is arranged, and the package substrate includes a substrate insulating layer, an upper wiring layer disposed on the substrate insulating layer, and/or a lower wiring layer disposed under the substrate insulating layer. Here, the metal layer on which the white insulating layer is laminated serves as the upper wiring layer. The white insulating layer is sealed off by a transparent resin or is covered with a lens-shaped transparent resin cover containing phosphors.

According to a twenty-first invention, in the twentieth invention, the substrate insulating layer is constituted by glass cloth or glass unwoven cloth impregnated with filler that has high thermal conductivity and that is made of an inorganic material.

According to a twenty-second invention, in the twentieth or twenty-first invention, respective lateral end surfaces of the substrate insulating layer and the upper wiring layer are positioned flush with each other, and a lateral end surface of the lower wiring layer is positioned inward of the lateral end surface of the substrate insulating layer.

According to a twenty-third invention, in the twentieth, twenty-first, or twenty-second invention, the upper wiring layer includes an upper separation portion extending in a first direction, and the lower wiring layer includes a lower separation portion of which part extends in a second direction different from the first direction.

According to a twenty-fourth invention, in any one of the twentieth to twenty-third inventions, the upper wiring layer and the lower wiring layer are coupled to each other through thermal vias.

According to a twenty-fifth invention, in any one of the twentieth to twenty-fourth inventions, a metal thin film layer is formed on each of surfaces of the upper wiring layer and the lower wiring layer.

According to a twenty-sixth invention, in any one of the first to twenty-fifth inventions, the white insulating layer has a thickness of 10 to 150 μm.

According to a twenty-seventh invention, in any one of the first to twenty-sixth inventions, the wiring is formed by applying ink, which contains silver particles and copper particles, with a drawing technique.

A twenty-eighth invention relates to a method of manufacturing a semiconductor device comprising a substrate on which LED packages are mounted, and a white insulating layer formed on a surface of the substrate, the method comprising the steps of forming the white insulating layer by applying a liquid material, which contains white inorganic pigment and $SiO_2$ in form of nanoparticles, to the surface of the substrate, and by baking the applied liquid material; forming wiring lines on the white insulating layer by coating and baking conductive metal ink; mounting LED chips on the substrate; and electrically connecting the LED chips to the wiring lines formed on the white insulating layer.

According to a twenty-ninth invention, in the twenty-eighth invention, the method further comprises a placement portion forming step of, prior to the step of forming the insulating layer, forming a projected placement portion in the surface of the substrate.

A thirtieth invention relates to a method of manufacturing a semiconductor device comprising a substrate on which LED chips are mounted, and a white insulating layer formed on a surface of the substrate, the method comprising the steps of constituting the substrate by bending a metal plate to form a bottom portion on which one or a plurality of LED chips is arranged, wall portions rising from both ends of the bottom portion, and edge portions extending from the wall portions substantially in a horizontal direction; forming a white insulating layer by applying a liquid material, which contains white inorganic pigment and $SiO_2$ in form of nanoparticles, to the surface of the substrate, and by baking the applied liquid material; forming wiring lines on the white insulating layer by coating and baking conductive metal ink; fixing the LED chips to the bottom portion of the substrate; and electrically connecting the LED chips to the wiring lines formed on the white insulating layer.

A thirty-first invention relates to a method of manufacturing a semiconductor device comprising a substrate on which LED chips are mounted, and a white insulating layer formed on a surface of the substrate, the method comprising the steps of constituting the substrate by forming, on a surface of a metal plate, a multilayer structure made up of an organic insulating layer as a lower layer and a wiring layer as an upper layer, and a separation portion that separates at least the wiring layer, and by bending the metal plate to form a bottom portion on which one or a plurality of LED chips is arranged, wall portions rising from both ends of the bottom portion, and edge portions extending from the wall portions substantially in a horizontal direction; forming a white insulating layer, by applying a liquid material, which contains white inorganic pigment and $SiO_2$ in form of nanoparticles, to respective surfaces of the bottom portion and the wall portions of the substrate except for regions where the LED chips are electrically connected, and by baking the applied liquid material; fixing the LED chips to the substrate; and electrically connecting the LED chips to wiring portions of the wiring layer.

According to a thirty-second invention, in the twenty-eighth to thirty-first inventions, the liquid material containing white inorganic pigment and $SiO_2$ in form of nanoparticles is applied by an ink jet method, a dispenser method, a spray coating method, or a screen printing method.

A thirty-third invention relates to a method of manufacturing a semiconductor device comprising a substrate on which one or a plurality of LED chips or one or a plurality of LED packages is mounted, and a white insulating layer formed on a surface of the substrate, the method comprising the steps of forming a wiring pattern by forming a metal layer on a base member surface of the substrate with interposition of an organic insulating layer therebetween, and by etching the metal layer; forming a white insulating layer by etching the organic insulating layer with the wiring pattern used as a mask, applying a liquid material, which contains white inorganic pigment and $SiO_2$ in form of nanoparticles, to at least a surface of the substrate, the surface including a region where the wiring pattern is not formed, and by baking the applied liquid material; mounting the LED chips or the LED packages onto the substrate; and electrically connecting the LED chips or the LED packages to the wiring pattern.

A thirty-fourth invention relates to a method of manufacturing a semiconductor device comprising a substrate on which one or a plurality of LED chips or one or a plurality of LED packages is mounted, and a white insulating layer formed on a surface of the substrate, the method comprising the steps of forming an upper wiring layer and a lower wiring layer respectively on upper and lower sides of a substrate insulating layer that constitutes a multi-piece substrate; forming a wiring pattern in each of the upper wiring layer and the lower wiring layer; forming vias that couple the upper wiring layer and the lower wiring layer to each other; forming a white insulating layer by applying a liquid material, which contains white inorganic pigment and $SiO_2$ in form of nanoparticles, on a surface of the upper wiring layer except for electrically connecting portions, and by baking the applied liquid material; mounting many LED chips onto the multi-piece substrate; electrically connecting the LED chips to the electrically connecting portions, respectively; sealing off the multi-piece substrate with resin in entirety; and dividing the multi-piece substrate into individual pieces.

According to a thirty-fifth invention, in the thirty-fourth invention, hardness of the resin is 86 or more in terms of Shore D hardness.

A thirty-sixth invention relates to a method of manufacturing a semiconductor device comprising a substrate on which one or a plurality of semiconductor chips is mounted, the method comprising the steps of forming a substrate insulating layer by impregnating glass cloth or glass unwoven cloth with filler that has high thermal conductivity and that is made of an inorganic material; constituting the substrate by forming an upper wiring layer and a lower wiring layer respectively on upper and lower sides of the substrate insulating layer; forming a wiring pattern in each of the upper wiring layer and the lower wiring layer; forming vias that couple the upper wiring layer and the lower wiring layer to each other; mounting the semiconductor chips onto the substrate; and electrically connecting the semiconductor chips to the upper wiring layer.

Advantageous Effects of the Invention

With the present invention, since a light source exhibiting less fluctuations in illumination, having high brightness, and emitting a great amount of light is constituted by many LED chips arranged at a high density, it is possible to provide an LED illumination apparatus that has high brightness and emits a great amount of light, and that is compact and lightweight.

Furthermore, the LED light source having high brightness and emitting a great amount of light can be manufactured at a low cost by employing a universal power supply device.

With the present invention, since a layer in which almost all ingredients are made of inorganic materials can be formed on the substrate, the LED illumination apparatus including an electrical insulating layer, which is superior in heat endurance, heat dissipation performance, and durability, can be provided.

Moreover, since the electrical insulating layer serves also as a reflection member, the use of an expensive reflection member is no longer required, and a separate process for forming a reflection layer is also no longer required.

In addition, the inorganic white insulating layer can be formed in desired shape and thickness at a desired position on the substrate by applying the liquid material, which contains the white inorganic pigment and $SiO_2$ in the form of nanoparticles, to the substrate surface, and then baking the liquid material.

BRIEF DESCRIPTION OF THE DRAWINGS

FIG. 1 is a side sectional view of an LED illumination module according to a first configuration example of the present invention.

FIG. 2 is a plan view of the LED illumination module according to the first configuration example of the present invention.

FIG. 5 is a side sectional view of an LED illumination module according to a third configuration example of the present invention.

FIG. 6 is a side sectional view of an LED illumination module according to a fourth configuration example of the present invention; specifically, FIG. 6(a) is a side sectional view illustrating a first mounting method for an LED chip, FIG. 6(b) is a side sectional view illustrating a second mounting method for the LED chip, and FIG. 6(c) is a side sectional view illustrating a third mounting method for the LED chip.

FIG. 7 is a side sectional view to explain steps of manufacturing a mounting substrate used in the LED illumination module according to the fourth configuration example of the present invention.

FIG. 8 is a side sectional view of an LED illumination module according to a fifth configuration example of the present invention.

FIG. 9 is a side sectional view of an LED illumination module according to a sixth configuration example of the present invention.

FIG. 10 is a graph depicting correlation between a thickness of an inorganic white insulating layer and a reflectance.

FIG. 11 is a side sectional view of an LED illumination module according to a seventh configuration example of the present invention.

FIG. 12 is a graph depicting reflectances of inorganic white insulating layers made of different materials and having different structures.

FIG. 13 is a graph depicting thermal resistances in LED illumination modules made of different materials and having different structures.

FIG. 14 is a side sectional view of an LED illumination module according to an eighth configuration example of the present invention.

FIG. 15 is a graph depicting overall light fluxes and light emission efficiencies in LED illumination modules having different structures.

FIG. 16 is a graph depicting surface temperatures and light emission efficiencies in LED illumination modules having different structures.

FIG. 19 is a side sectional view (i.e., a sectional view taken along AA in FIG. 20(a)) of an LED illumination module according to an eleventh configuration example of the present invention.

FIG. 20(a) is a plan view of the LED illumination module according to the eleventh configuration example, and FIG. 20(b) is a sectional view taken along BB in FIG. 20(a).

FIG. 21 is a plan view of an LED illumination module according to a twelfth configuration example of the present invention.

FIG. 22 is a plan view of an LED illumination module according to a thirteenth configuration example of the present invention.

FIG. 23 illustrates a configuration of a protection diode device connecting a pair of electrode units.

MODE FOR CARRYING OUT THE INVENTION

Figure 3:
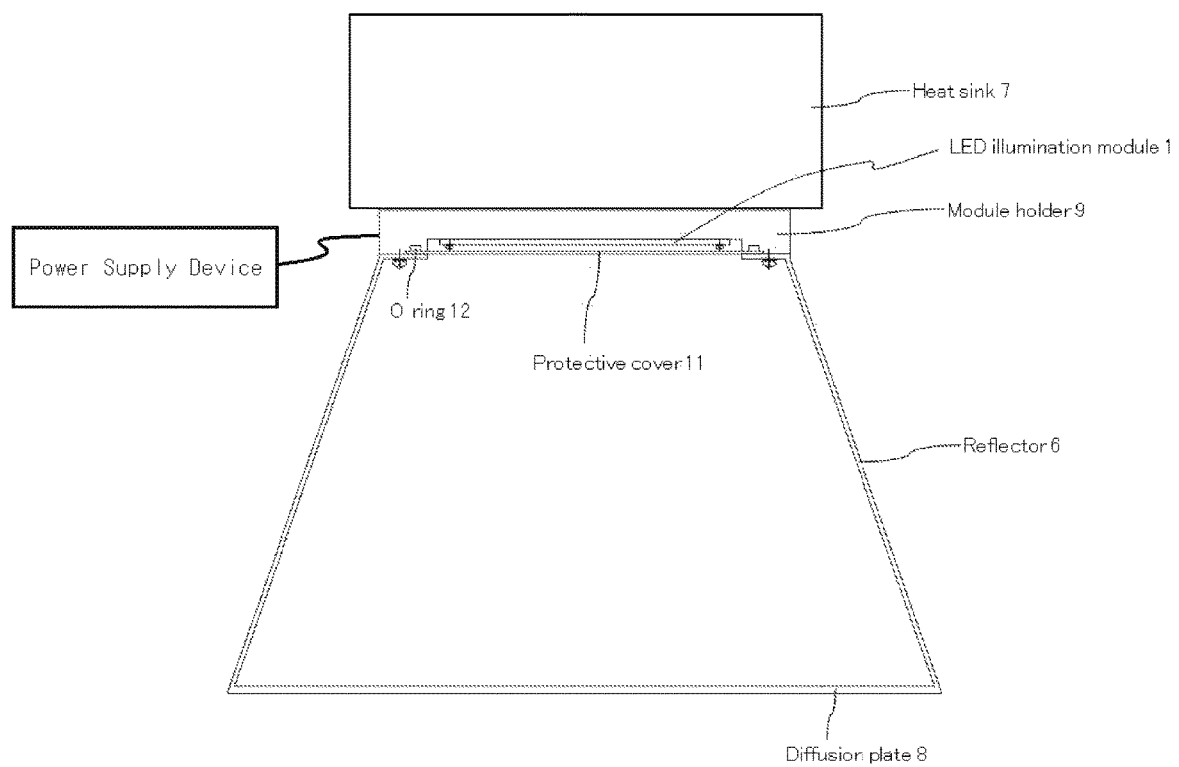
FIG. 3 is a side view of an LED illumination apparatus according to the first configuration example of the present invention.

In an LED illumination module according to the present invention, a light source of several hundreds watts (e.g., 200 to 1000 W) is constituted by COB-mounting a large number (e.g., 100 to 2000) of LED elements (LED dice) each in class having several watts (e.g., 0.5 to 4 W). Such an LED illumination module is employed, as described later, to constitute an LED illumination apparatus by providing a structure to dissipate heat from a rear surface of a mounting substrate to a heat sink through a heat spreader, and by attaching a reflection member (and/or a lens). The present invention will be described below in connection with examples.

First Configuration Example

FIG. 1 is a side sectional view of an LED illumination module 1 according to a first configuration example of the present invention, and FIG. 2 is a plan view of the LED illumination module 1 according to the first configuration example of the present invention. The LED illumination module 1 according to the first configuration example includes, as main components, LED chips 3, and a mounting substrate 2 on which wiring lines 13, an inorganic white insulating layer 14, and projected placement portions 47 are formed.

The LED chips 3 are each, e.g., InGaN-based blue LED bare chip. Many LED chips 3 are arranged within a reflection region 49 in an array of n rows×m columns (e.g., 5 rows×5 columns), and are mounted by the so-called COB (Chip On Board) mounting. Each LED chip 3 is connected to the wiring line 13 or another adjacent LED chip 3 through, e.g., a thin gold wire by wire bonding. A rear surface (lower surface) of the LED chip 3 is fixed to the projected placement portion 47 by, e.g., an adhesive having high thermal conductivity.

In order to increase luminosity per unit area and to realize high brightness, it is important to mount the many LED chips 3, each emitting a certain amount of light or more, within the reflection region at a high density. The term "reflection region" used here implies a region where the many LED chips are sealed off with resin. In the case including a dam member, the reflection region implies a region surrounded by the dam member. A mounting area density (chip mounting area occupancy ratio) of the LED chips 3 within the reflection region is preferably 15 mm$^2$/cm$^2$ or more, and more preferably 20 mm$^2$/cm$^2$ or more. The LED chip 3 is selected, for example, such that its brightness at the reflection region is preferably 7.0 [lm/mm$^2$] or more and more preferably 10.0 [lm/mm$^2$] or more. For example, an LED chip 3 with a maximum rated current of 100 mA or more, preferably 300 mA or more, and more preferably 500 mA or more is disclosed here as the LED chip 3 that is adapted for realizing the above-mentioned brightness. All the many LED chips have the same specifications.

The projected placement portions 47 are provided in places on the mounting substrate 2 where the LED chips 3 are mounted. The projected placement portions 47 are each made of a member having good thermal conductivity, and formed, for example, by applying a metal paste material, e.g., a copper paste, a silver paste, or a solder paste, and then baking the applied metal paste material. Alternatively, the projected placement portions 47 may be formed by etching a metal substrate. In the case of a substrate having a structure in which the heat pipe is formed by stacking copper plates, the copper plates may be stacked after forming the projected placement portions 47 only on the copper plate that is positioned as an uppermost layer. An upper surface of each projected placement portion 47 is formed to be flat in consideration of adhesivity with respect to a rear surface of the LED chip 3.

The mounting substrate 2 is made of a material having good thermal conductivity and electrical characteristics, and it is constituted by, e.g., a copper plate or an aluminum plate. When a material having low thermal conductivity, such as a glass epoxy resin, is used as the mounting substrate 2, there may occur a doughnut phenomenon that the amount of light is reduced particularly in a light-emission central region where the heat dissipation performance degrades to a larger extent. The mounting substrate 2 is a rectangular, polygonal, or circular substrate, and it has an area of 5,000 mm$^2$ or more and 20,000 mm$^2$ or less. The inorganic white insulating layer 14 serving also as a reflection member is formed on a surface of the mounting substrate 2. The inorganic white insulating layer 14 has an average reflectance of preferably 70% or more and more preferably 80% or more in a visible wavelength range. The inorganic white insulating layer 14 contains white inorganic powder (white inorganic pigment) and silicon dioxide ($SiO_2$) as main ingredients. The inorganic white insulating layer 14 is formed by applying ink (hereinafter referred also to as "white inorganic ink"), which is prepared by mixing those ingredients with a solvent of diethylene glycol monobutyl ether, which contains organic phosphoric acid, and then baking the applied ink. Here, the white inorganic ink is applied by, e.g., an ink jet method, a dispenser method, a spray coating method, or a screen printing method. A thickness of the inorganic white insulating layer 14 is desired to be thinner from the viewpoint of heat dissipation characteristics, but the inorganic white insulating layer 14 is required to have a certain thickness from the viewpoint of voltage resistance and tearing strength. Because the voltage resistance of an insulating film required for mounting of an LED is generally 1.5 to 5 kV and a white inorganic insulator has a voltage resistance of about 1 KV/10 μm, a thickness of the insulating film is preferably set to 15 μm or more though depending on a mixing ratio of the white inorganic powder and the silicon dioxide. On the other hand, in order to prevent the heat dissipation performance from degrading due to the presence of the inorganic white insulating layer 14, the thickness of the inorganic white insulating layer 14 is preferably set to a certain value or less. Thus, the thickness of the inorganic white insulating layer 14 is set to fall, for example, in the range of 10 to 150 μm, preferably 15 to 100 μm, more preferably 25 to 70 μm, even more preferably 30 to 60 μm, further even more preferably 40 to 60 μm, and most preferably 40 to 50 μm. The relationship between a thickness of the inorganic white insulating layer 14 and a reflectance will be described later with reference to FIG. 10.

The inorganic white insulating layer 14 is formed in a region (reflection region 49) surrounding the many projected placement portions 47 on the mounting substrate 2 substantially at the same height as the projected placement portions 47 or slightly lower than the projected placement portions 47. Thus, the reflection region 49 has substantially a flat surface. The thickness of the inorganic white insulating layer 14 may be changed between the reflection region 49 and a region outside the reflection region 49. For example, the thickness of the inorganic white insulating layer 14 may be increased in the outer region than in the reflection region 49 to enhance the voltage resistance. Alternatively, the inorganic white insulating layer 14 may be formed flat without providing the projected placement portions 47.

The reflection region 49 is surrounded by a dam member 48 at least a surface of which has light reflectivity, and a transparent resin 5 is filled inside the dam 48. The dam member 48 serves to prevent a sealing resin from flowing in the manufacturing process, and it is made of, e.g., a resin or metal material. While the dam member 48 is fixedly disposed in this configuration example, the dam member 48 may be disposed in a removable manner instead.

One or more phosphors to obtain a white color, for example, are mixed in the transparent resin 5. As methods for obtaining white light, there are a method of exciting phosphors in three primary colors by an ultraviolet LED, a method of exciting phosphors in two colors, i.e., green and red, by a blue LED, and a method of exciting a phosphors in yellow by a blue LED. Thus, one or more phosphors selected depending on the type of the LED chip 3 are mixed in the transparent resin 5. The color temperature is set to fall in the range of 2700 to 6500 K, for example.

On the inorganic white insulating layer 14, the wiring lines 13 are formed at necessary locations. The wiring lines 13 can be formed through the steps of forming a metal layer by, e.g., vapor deposition or sputtering, coating a resist over the metal layer, carrying out exposure and development of a pattern, and etching the resist to remove it. However, the wiring lines 13 are preferably formed by applying conductive metal ink (e.g., silver ink or hybrid ink in a mixture of silver and copper) to necessary locations with a drawing technique by the ink jet method or the dispenser method, for example, and then baking the applied ink for conversion into metal. When the surface of the inorganic white insulating layer 14 is repellent to water, the connection wiring lines are formed after removing water-repellent residues and activating the surface by, e.g., plasma treatment and, if required, carrying out primer treatment (e.g., coating an epoxy primer) to increase adhesion between materials.

A solder resist layer made of a transparent inorganic material may be formed, when required, on the mounting substrate 2. A transparent film constituting the solder resist layer can be made of, e.g., silicon dioxide ($SiO_2$). The transparent film is formed by applying a sol (liquid coating agent), which contains $SiO_2$ (average particle diameter of 50 nm or less), or a solution, which contains polysilizane, to necessary locations by the ink jet method or the dispenser method, and then baking the applied sol or solution.

With the LED illumination module 1 according to this configuration example, heat generated from the LED chips 3 can be efficiently dissipated to the mounting substrate 2 through the projected placement portions 47, and hence an illumination module having good heat dissipation performance can be provided. Since an electrical insulating layer in this configuration example is entirely formed by the inorganic white insulating layer, a risk of discoloration of the organic insulating layer can be eliminated.

<Inorganic White Insulating Layer>

Main features of the white insulating layer used in the LED illumination module 1 according to the present invention will be described below.

The first feature is that 80 weight % or more (preferably 85 weight % or more, more preferably 90 weight % or more, and even more preferably 95 weight % or more) of the white insulating layer in the formed state is made of an inorganic material. When the ink made of an inorganic material at 90 weight % or more is applied and fired, the insulating layer containing substantially no organic materials can be formed.

The second feature is that silicon dioxide ($SiO_2$) constituting the inorganic material is in the form of nanoparticles. Here, the particle diameter of white inorganic powder constituting the inorganic material is preferably 1 μm or less. More preferably, the white inorganic powder constituting the inorganic material is also in the form of nanoparticles. By employing at least $SiO_2$ in the form of nanoparticles, the liquid material made of the inorganic material at 80 weight % or more (i.e., the white inorganic ink), which has had a difficulty in application so far, can be applied practically. Furthermore, a reflectance is also increased because the particle diameter is much smaller than the wavelength of light. Here, the term "nanoparticles" implies nanoparticles having diameters of several nm to several hundreds nm. $SiO_2$ used here preferably has an average particle diameter of 50 nm or less. In addition, $SiO_2$ preferably contains nanoparticles having particle diameters of 20 nm or less and more preferably 10 nm or less. The content of $SiO_2$ in the inorganic white insulating layer in the formed state is preferably 25 weight % or more and more preferably 30 to 40 weight %.

For example, titanium oxide, zinc oxide, magnesium oxide (MgO), alumina, or a combination of the formers is used as the white inorganic pigment. The content of the white inorganic pigment in the inorganic white insulating layer in the formed state is adjusted as appropriate depending on the demanded reflectance, etc., but it is preferably 40 to 70 weight % and more preferably 50 to 65 weight %. The reason is that a sufficient reflection effect can be obtained with the content of 40 weight % or more, and fluidity of the ink required to form a uniform film can be ensured with the content of 70 weight % or less.

The white inorganic powder preferably has an average particle diameter of 50 nm or less. In addition, the white inorganic powder more preferably contains nanoparticles having particle diameters of 25 nm or less. That white inorganic powder in the form of nanoparticles is suitable for being applied by the ink jet method, the dispenser method, or the spray coating method.

The white inorganic powder may be used in a state where the particle surface is coated with a transparent insulating film. The transparent insulating film is, for example, an alumina coating or a silica coating. From the viewpoint of thermal conductivity, the alumina coating is preferably used. The white inorganic particle coated with the transparent insulating film has an average particle diameter of, e.g., 10 nm to 5 μm (preferably 1 μm or less), and the coated film has a thickness of 10 to 50 nm. It can be expected that coating the transparent insulating film also contributes to suppressing the problem with deterioration of the transparent resin in the LED attributable to the catalyst effect of titanium oxide.

In order to increase the heat dissipation performance of the inorganic white insulating layer, filler having high thermal conductivity and made of an inorganic material (e.g., silicon carbide (SiC) coated with an alumina film of nm size) may be mixed into the above-mentioned liquid material (white inorganic ink). For example, SiC has a thermal conductivity of about 160 w/m·k, i.e., about 20 times that of titanium dioxide ($TiO_2$). As a proportion of the filler having high thermal conductivity increases, the heat dissipation performance also increases, but the reflectance reduces. Therefore, the filler is mixed at a proportion of 1 to 30, preferably 5 to 20, and more preferably 5 to 15 with respect to weight 100 of the white inorganic pigment.

By applying the above-described white inorganic ink made of the insulating material on a metal plate and heating the applied ink at 160 to 200° C., for example, the nano-size insulating particles dispersed in the solvent are arrayed following to irregularities of the substrate surface, and a dense inorganic white insulating layer (film) is formed after evaporation of the solvent. In other words, a multilayer structure of the inorganic white insulating layer and the metal layer can be formed by heating nano-size ceramic mixed powder under the atmospheric pressure while the powder is held in direct contact with the metal surface, thereby sintering the powder there and forming a metal surface junction at the joined interface with utilization of a diffusion state due to the nano-size effect. Thus, according to the present invention, the inorganic white insulating layer can be formed in desired shape and thickness at a desired position on the substrate by preparing the insulating material, which constitutes the inorganic white insulating layer, in the form of ink. According to the present invention, as another example, after forming recesses in the substrate surface, the white insulating layer may be apply to and form in a region of the substrate surface except for the placement portions where the LED chips 3 are to be placed.

With the LED illumination module 1 according to this configuration example, since the inorganic white insulating layer 14 functions also as the reflection member, there is no need of separately disposing an expensive reflection member, and the material cost can be cut to a large extent. For example, even when the mounting substrate 2 is made of copper and the inorganic white insulating layer is formed on a surface of that mounting substrate 2 by employing the white inorganic ink, strong adhesion is obtained between them, and the problem of peeling-off can be overcome which may occur when an organic insulating layer is formed. Furthermore, the manufacturing process can be said as being superior in cost effectiveness because a step of forming the reflection member can be omitted. Trial calculation shows that, in comparison with the case using a silver plating as the reflection member, for example, the material cost is cut to about ½ per package. A greater cost reduction effect is expected per illumination module. Moreover, the insulating layer made of the white inorganic material has thermal conductivity higher than that of, e.g., the glass epoxy resin substantially by one order, and has higher heat dissipation performance. According to trial calculation, that insulating layer has the heat dissipation performance 2 to 5 times that of a PLCC (Plastic leaded chip carrier) with a similar configuration. In addition, a sulfidation phenomenon can be inhibited by covering the metal surface on the substrate with the inorganic white insulating layer 14.

<LED Illumination Apparatus>

FIG. 3 is a side view of an LED illumination apparatus according to the first configuration example. The LED illumination apparatus includes the LED illumination module 1, a reflector 6, a heat sink 7, a diffusion plate 8, a module holder 9, and a power supply device.

The LED illumination module 1 is fixedly held using fixtures, such as screws, in such a state that a rear surface of a heat spreader 10, attached to a rear surface of the LED illumination module 1 (specifically, to a rear surface of the mounting substrate 2), is in contact with an abutment surface of the module holder 9. As a preferred combination of the mounting substrate 2 and the heat spreader 10, it is disclosed here, for example, to constitute the mounting substrate 2 by a copper plate and to use FGHP made by Molex Kiire Co., Ltd. (see Patent Document 3) as the heat spreader 10. A heat transfer member, e.g., heat dissipation grease or a heat dissipation sheet, is interposed between the rear surface of the heat spreader 10 and the contact surface of the module holder 9 when required. The module holder 9 is made of a metal material having good thermal conductivity, such as copper or aluminum. Heat generated from the LED illumination module 1 is conducted to the heat sink 7 through the module holder 9.

The heat sink 7 may be of the natural cooling type, the water cooling type, or the type including an electric fan. When many LED chips of several watts class are mounted at a high density, there is a problem causing a doughnut phenomenon that the temperature in a mounting region becomes high, and the amount of light is reduced particularly in a light-emission central region where the heat dissipation performance is poor. It is therefore important to employ not only the heat spreader having a particularly high heat-diffusion ability, but also the heat sink having a particularly high cooling ability.

The reflector 6 and the transparent protective cover 11 are joined to the module holder 9 on the side illuminating light. The protective cover 11 is pressed against the module holder 9 through the O ring 12, and it also serves as a waterproof cover. In the LED illumination apparatus according to the first configuration example, the diffusion plate 8 is disposed in an opened area of the reflector 6. The provision of the diffusion plate 8 contributes to preventing contamination with dusts, etc. and glare (dazzle). Because the diffusion plate 8 widens a light distribution angle, the light distribution angle of the reflector 6 is designed to be narrower than that in the case where the diffusion plate is not disposed. It is to be noted that the diffusion plate is not an essential component, and that a transparent protective cover may be disposed instead of the diffusion plate.

The LED illumination apparatus according to the first embodiment, constituted as described above, has such a compact external shape that the opened area of the reflector 6 is about φ350 mm and the height from the opened area of the reflector 6 to the heat sink is about 500 mm, while it has high brightness and emits a great amount of light. The weight of the LED illumination apparatus is as light as about 9 kg.

Second Configuration Example

Figure 4:
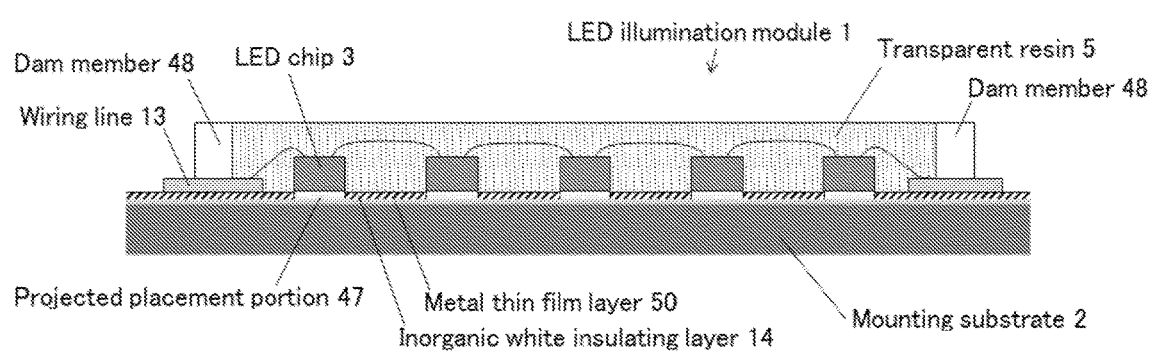
FIG. 4 is a side sectional view of an LED illumination module according to a second configuration example of the present invention.

FIG. 4 is a side sectional view of an LED illumination module according to a second configuration example.

The LED illumination module 1 according to the second configuration example is similar to the module according to the first configuration example in that a plurality of LED chips 3 is COB-mounted, but is different in including a metal thin film layer 50 that is disposed on an upper surface of the mounting substrate 2.

In this configuration example, the metal thin film layer 50 made of, e.g., silver, chromium, nickel or aluminum is formed on the upper surface of the mounting substrate 2 by plating, vapor deposition, or painting. The thickness of the inorganic white insulating layer 14 can be reduced in consideration of the thickness of the metal thin film layer 50, whereby the heat radiation effect can be increased correspondingly. Moreover, the provision of the metal thin film layer 50 in the reflection region contributes to reducing irregularities in the surface of the mounting substrate 2, and to increasing the optical reflectance.

A projected placement portion 47 is similar to that in the first configuration example. Thus, the projected placement portion 47 is formed, for example, by applying a metal paste material, e.g., a copper paste, a silver paste, or a solder paste, and then baking the applied metal paste material.

One example of a process for manufacturing the LED illumination module 1 according to this configuration example will be described below.

(1) The metal thin film layer 50 is formed on a substrate by plating, vapor deposition, or painting.

(2) On the metal thin film layer 50, the projected placement portions 47 are formed by applying a metal paste material to necessary locations with a drawing technique by the ink jet method or the dispenser method, for example, and then baking the applied metal paste material for conversion into metal.

(3) A frame substrate, i.e., an aggregate of the plural mounting substrates 2, is obtained by applying the white inorganic ink over the substrate except for the projected placement portions 47 by printing (screen printing or flexographic printing), the ink jet method, or the dispenser method, and then baking the applied white inorganic ink at 200° C.×60 minutes.

(4) The wiring lines 13 are formed by copper-foil etching or screen printing.

(5) The LED chips 3 are mounted on the frame substrate and are electrically connected by wire bonding.

(6) After resin-molding the frame substrate, the individual LED illumination modules 1 are obtained by cutting the frame substrate into pieces by a cutting blade.

With the LED illumination module 1 according to this configuration example, since the thickness of the inorganic white insulating layer 14 can be reduced and heat from the LED chip 3 can be efficiently dissipated from the projected placement portion 47 to the mounting substrate 2, the LED illumination module having good heat dissipation performance can be obtained. Furthermore, since the thickness of the inorganic white insulating layer 14 can be reduced, it is further possible to realize diversification in the method of applying the white inorganic ink and higher efficiency of the manufacturing process.

Third Configuration Example

FIG. 5 is a side sectional view of an LED illumination module according to a third configuration example.

The LED illumination module 1 according to the third configuration example is different from the module according to the second configuration example in that the projected placement portions 47 are not provided on the upper surface of the mounting substrate 2 and placement portions 16 are formed instead.

In this configuration example, the metal thin film layer 50 made of, e.g., silver, chromium, nickel or aluminum is formed on the upper surface of the mounting substrate 2 by plating, vapor deposition, or painting. Then, the placement portions 16 are formed as recesses where the metal thin film layer 50 is exposed. As a result, the reflection effect and the heat dissipation effect are realized.

According to this configuration example, the reflection effect can be obtained with the exposed metal thin film layer 50 even when an area of the placement portion 16 is slightly greater than a bottom area of the LED chip 3.

Fourth Configuration Example

FIG. 6 is a side sectional view of an LED illumination module 1 according to a fourth configuration example.

In the LED illumination module 1 of FIG. 6(*a*), the LED chip 3 is face-down mounted such that electrodes (e.g., stud bumps) provided on a surface (lower surface) of the LED chip 3 are connected by soldering, for example, to the wiring lines 13 formed on the mounting substrate 2. Thus, the so-called flip chip mounting is employed. In the flip chip mounting, because a chip is mounted in a face-down state, the chip surface is faced downwards. It is to be noted that, in the flip chip mounting, because a chip is mounted to wiring lines through bumps, a slight gap is formed between the chip and a substrate, and such a gap is filled with, e.g., resin called underfill in some cases. In this Description, however, the underfill is not illustrated. A base material of the mounting substrate 2 is a material having good thermal conductivity and electrical characteristics, and it is constituted by, e.g., a copper plate or an aluminum plate. The wiring lines 13 are formed on organic insulating layers 30 made of a known organic material (e.g., polyimide). The above-described inorganic white insulating layer 14 is applied and formed in a region of the base material surface of the mounting substrate 2 where the wiring lines 13 and the organic insulating layers 30 are not disposed. A region of a lower surface of the LED chip 3, which region is not contacted with the wiring line 13, is contacted with the inorganic white insulating layer 14 directly or through the underfill, thus dissipating heat from the mounting substrate 2 through the inorganic white insulating layer 14. The transparent resin 5 is formed by filling a transparent resin into a removable molding frame or a fixed surrounding member.

In the LED illumination module 1 of FIG. 6(*b*), the LED chip 3 is face-down (flip-chip) mounted such that protrusive electrodes (bumps) provided on the lower surface of the LED chip 3 are electrically connected to the wiring lines 13, which are formed on the mounting substrate 2, in electrically connecting portions 31. The mounting substrate 2 and the wiring lines 13 are the same as those in the above configuration of FIG. 6(*a*). In the configuration of FIG. 6(*b*), the inorganic white insulating layer 14 is applied and formed to directly or indirectly cover the entire upper surface of the mounting substrate 2 except for openings of the electrically connecting portions 31. The opening of each electrically connecting portion 31 has a size of, e.g., 50 to 500 μm square. Also in this configuration (b), a region of the lower surface of the LED chip 3 except for the electrically connecting portions 31 is contacted with the inorganic white insulating layer 14 directly or through the underfill In the LED illumination module 1 of FIG. 6(*c*), the LED chip 3 is connected to the wiring lines 13 by wire bonding. The mounting substrate 2, the wiring lines 13, and the inorganic white insulating layer 14 are the same as those in the above configuration of FIG. 6(*a*). The rear surface (lower surface) of the LED chip 3 is fixed to the upper surface of the mounting substrate 2 by employing, e.g., an adhesive having high thermal conductivity.

FIG. 7 is a side sectional view to explain steps of manufacturing the mounting substrate used in the fourth configuration example of the LED illumination module embodying the present invention.

First, an organic insulating layer (e.g., a polyimide layer) and a copper foil layer are formed on a substrate (STEP 1). Those layers are formed, for example, by stacking a thermoplastic polyimide film and a copper foil on a metal plate, and pressing them at high temperature (e.g., at 350° C. for 20 minutes).

Next, the affixed copper foil is subjected to patterning (STEP 2). For example, the patterning is performed by photolithography. The photolithography is executed through the steps of coating a resist over the copper foil, carrying out exposure and development of a pattern, and etching the resist to remove it, thereby forming copper-foil removed portions.

Next, the organic insulating layer is etched with the copper foil used as a mask (STEP 3). For example, an amine-based solution is used as a polyimide etching solution in many cases.

Finally, a white inorganic material is applied so as to fill the copper-foil removed portions in the mounting substrate 2 (STEP 4). Here, the white inorganic material is applied in different ways depending on the desired configuration (see FIG. 6) of the LED illumination module. More specifically, (a) in STEP 4 represents the configuration in which the white inorganic material is applied up to a height substantially at the same level as the wiring lines, and (b) represents the configuration in which the white inorganic material is applied in a state partly covering the wiring lines except for the openings for electrical connection. One example of a method for applying the white inorganic material in (b) is screen printing. In another example of the method, the white inorganic material is applied over the entire surface including the wiring lines, and openings are then formed corresponding to the wiring lines by a laser. Still another example is a two-step applying method in which the white inorganic material is applied up to the same height as the wiring lines by screen printing or by employing a dispenser, and thereafter the white inorganic material is further applied to regions except for the openings corresponding to the wiring lines by printing (e.g., screen printing or flexographic printing), or by employing a dispenser.

Fifth Configuration Example

FIG. 8 is a side sectional view illustrating a fifth configuration example of an LED illumination module 1 embodying the present invention. The LED illumination module 1 according to the fifth configuration example is different from the module according to the fourth configuration example (a) in that the inorganic white insulating layer is made up of a lower layer denoted by a reference symbol 14*a* and an upper layer denoted by 14*b*. In the following, only different points from the fourth configuration example (a) are described while descriptions of the same points are omitted. It is a matter of course that the inorganic white insulating layers 14*a* and 14*b* in the fifth configuration example (FIG. 9) can be applied to the fourth configuration examples (b) and (c) as well.

The inorganic white insulating layer 14*a* is a layer in which zinc oxide is used as the white inorganic pigment, and the inorganic white insulating layer 14b is a layer in which titanium dioxide is used as the white inorganic pigment. Zinc oxide particles constituting the lower layer 14a of the inorganic white insulating layer are coated with a transparent insulating film (e.g., an alumina film) and have an average particle diameter of 1 μm or less. Titanium dioxide particles constituting the upper layer 14b of the inorganic white insulating layer are nano-sized particles or particles coated with a transparent insulating film (e.g., an alumina film) and having an average particle diameter of 1 μm or less.

The reason of employing such a multilayer structure as the inorganic white insulating layer resides in not only taking into account the case where a satisfactory reflectance is not obtained with only the layer using zinc oxide as the white inorganic pigment, but also utilizing superior characteristics of zinc oxide in thermal conductivity. In other words, an inorganic white insulating layer having characteristics of low thermal resistance and good reflectance can be obtained by forming, as the lower layer 14a, an insulating layer using zinc oxide as the white inorganic pigment, and as the upper layer 14b, an insulating layer using titanium dioxide as the white inorganic pigment. Here, it is essential that the zinc oxide particles are coated with the transparent insulating film, while the titanium dioxide particles may be coated or may not be coated with the transparent insulating film. As the white inorganic material having good thermal conductivity, which is used to form the multilayer structure, the zinc oxide particles may be replaced with another type of white inorganic material having higher thermal conductivity than magnesium oxide (MgO) or titanium dioxide.

While, in FIG. 8, the lower layer 14a and the organic insulating layer 30 are illustrated as having the same thickness and the upper layer 14b and the wiring line 13 are illustrated as having the same thickness, the present invention is not limited to that case. Respective thicknesses of the lower layer 14a and the upper layer 14b are determined as appropriate from the viewpoint of thermal conductivity, reflection performance, and insulation performance.

Sixth Configuration Example

FIG. 9 is a side sectional view illustrating a sixth configuration example of an LED illumination module 1 embodying the present invention.

The LED illumination module 1 according to the sixth configuration example is different from the module according to the third configuration example in that the white insulating layer is made up of an inorganic white insulating layer 141 constituting a first layer, an inorganic white insulating layer 142 constituting a second layer, and an inorganic white insulating layer 143 constituting a third layer.

The insulating layer can be formed as a multilayer structure by employing the screen printing method. The manufacturing cost can be reduced without degrading the required functions by increasing the number of layers in a region that is necessary for insulation, and by reducing the number of layers in a region that is necessary for heat dissipation and reflection. It is here disclosed, for example, to constitute the white insulating layer that is made up of three layers (or two layers) in a region just under the wiring line 13 and two layers (or one layer) in other regions.

The inorganic white insulating layer 141 has a thickness of about 20 μm, the inorganic white insulating layer 142 has a thickness of about 20 μm, and the inorganic white insulating layer 143 has a thickness of about 60 μm. In consideration of the heat dissipation performance, the LED chip 3 is mounted on the inorganic white insulating layer 141. Accordingly, when the inorganic white insulating layer 142 is applied and formed, the placement portion 16 is provided in the form of a recess where the inorganic white insulating layer 141 is exposed.

The inorganic white insulating layers 141 to 143 may be all formed by applying white inorganic inks made of the same materials. Alternatively, a thermal conductivity of the white inorganic pigment contained in the inorganic white insulating layer 141 may be set to be higher than that of the white inorganic pigment contained in the inorganic white insulating layer 142 (and 143).

FIG. 10 is a graph depicting correlation between a thickness of the inorganic white insulating layer and a reflectance. The reflectance was measured after forming the inorganic white insulating layer in different thicknesses on the surface of the mounting substrate 2 made of a copper plate. The white inorganic pigment contained in the white insulating layer is titanium dioxide. As seen from FIG. 10, the reflectance was reduced when the thickness of the white insulating layer was 15 μm. However, it was confirmed that a reflectance comparable to the reflectance of a glossy silver plating was obtained when the thickness of the white insulating layer was 33 μm or more.

Seventh Configuration Example

FIG. 11 is a side sectional view illustrating a seventh configuration example of an LED illumination module 1 embodying the present invention.

The LED illumination module 1 according to the seventh configuration example is similar to the module according to the sixth example in that the inorganic white insulating layer is made up of the inorganic white insulating layer 141, the inorganic white insulating layer 142, and the inorganic white insulating layer 143, but it is different from the module according to the sixth configuration example in that the inorganic white insulating layer 141, the inorganic white insulating layer 142, and the inorganic white insulating layer 143 are made of different materials, and that the LED chips 3 are placed on the inorganic white insulating layer 142.

The inorganic white insulating layer 141 contains magnesium oxide (MgO) as the white inorganic pigment, and each of the inorganic white insulating layer 142 and the inorganic white insulating layer 143 contains titanium dioxide ($TiO_2$) as the white inorganic pigment. Zinc oxide (ZnO) may be used as the white inorganic pigment in the inorganic white insulating layer 141.

FIG. 12 is a graph depicting reflectances of inorganic white insulating layers made of different materials and having different structures.

In FIG. 12, (1) represents the reflectance when magnesium oxide (MgO) is used as the white inorganic pigment and the film thickness is set to 15 μm, and (4) represents the reflectance when titanium dioxide ($TiO_2$) is used as the white inorganic pigment and the film thickness is set to 15 μm. As seen from the results of (1) and (4), when the film thickness of the inorganic white insulating layer is set to 15 μm, the reflectance of magnesium oxide (MgO) is inferior.

In FIG. 12, (2) represents the reflectance when magnesium oxide (MgO) is used as the white inorganic pigment for the first inorganic white insulating layer (film thickness of 15 μm) that is positioned on the side closer to the mounting substrate, and when titanium dioxide ($TiO_2$) is used as the white inorganic pigment for the second inorganic white insulating layer (film thickness of 15 μm) that is positioned on the side closer to the outside. (3) Represents the reflectance when titanium dioxide ($TiO_2$) is used as the white inorganic pigment and the film thickness is set to 30 μm. As seen from the results of (2) and (3) when a total thickness of the inorganic white insulating layer is 30 μm, there is no significant difference in the reflectance even when magnesium oxide (MgO) is used as the white inorganic pigment.

FIG. 13 is a graph depicting thermal resistances in LED illumination modules 1 made of different materials and having different structures. When the LED chip is mounted to the mounting substrate with the inorganic white insulating layer interposed therebetween, the thermal resistance is increased corresponding to the interposition of the inorganic white insulating layer. However, only the thermal resistance can be reduced without reducing the reflectance by employing magnesium oxide (Mg) as the white inorganic pigment in the second inorganic white insulating layer. Because the thermal conductivity of titanium dioxide is about 8 w/m·k and the thermal conductivity of magnesium oxide is about 45 w/m·k, it is deemed that the difference in thermal resistance is attributable to the difference in thermal conductivity.

With the above-described LED illumination module 1 according to the seventh configuration example, the heat dissipation performance can be increased while a high reflectance is maintained.

Eighth Configuration Example

FIG. 14 is a side sectional view illustrating an eighth configuration example of an LED illumination module 1 embodying the present invention.

The LED illumination module 1 according to the eighth configuration example is different from the module according to the seventh configuration example in that the LED chip 3 is placed on the mounting substrate 2. The other configuration is similar to that in the seventh configuration example. With the eighth configuration example, the reflection effect comparable to that in the seventh configuration example can be obtained. In addition, since heat generated from the rear surface of the LED chip 3 is directly conducted to the mounting substrate 2, higher heat dissipation performance can be realized.

FIG. 15 is a graph depicting overall light fluxes and light emission efficiencies in LED illumination modules 1 having different structures.

In FIG. 15, (1) represents the overall light flux when titanium dioxide ($TiO_2$) is used as the white inorganic pigment in both the first inorganic white insulating layer positioned on the side closer to the mounting substrate and the second inorganic white insulating layer positioned on the side closer to the outside, and when the LED chip is mounted on the second inorganic white insulating layer. (2) Represents the overall light flux when the LED chip is mounted on the first inorganic white insulating layer on condition that the inorganic white insulating layer has the same configuration as in (1). (3) Represents the overall light flux when the LED chip is mounted on the mounting substrate on condition that the inorganic white insulating layer has the same configuration as in (1). As seen from the results of (1) to (3), there is no significant difference in the overall light flux depending on the thickness of the layer on which the LED chip is placed.

In FIG. 15, (4) represents the light emission efficiency in the same configuration as that in (1). (5) Represents the light emission efficiency in the same configuration as that in (2), and (6) represents the light emission efficiency in the same configuration as that in (3). As seen from the results of (4) to (6), there is no significant difference in the light emission efficiency depending on the depth of the layer on which the LED chip is placed.

FIG. 16 is a graph depicting surface temperatures and light emission efficiencies in LED illumination modules 1 having different structures.

In FIG. 16, (1) represents the surface temperature when titanium dioxide ($TiO_2$) is used as the white inorganic pigment in both the first inorganic white insulating layer positioned on the side closer to the mounting substrate and the second inorganic white insulating layer positioned on the side closer to the outside, and when the LED chip is mounted on the second inorganic white insulating layer. (2) Represents the surface temperature when the LED chip is mounted on the first inorganic white insulating layer on condition that the inorganic white insulating layer has the same configuration as in (1). (3) Represents the surface temperature when the LED chip is mounted on the mounting substrate on condition that the inorganic white insulating layer has the same configuration as in (1). As seen from the results of (1) to (3), the surface temperature is higher at a greater thickness of the layer on which the LED chip is placed.

In FIG. 16, (4) represents the light emission efficiency in the same configuration as that in (1). (5) Represents the light emission efficiency in the same configuration as that in (2), and (6) represents the light emission efficiency in the same configuration as that in (3). As seen from the results of (4) to (6), there is no significant difference in the light emission efficiency depending on the depth of the layer on which the LED chip is placed.

Ninth Configuration Example

Figure 17:
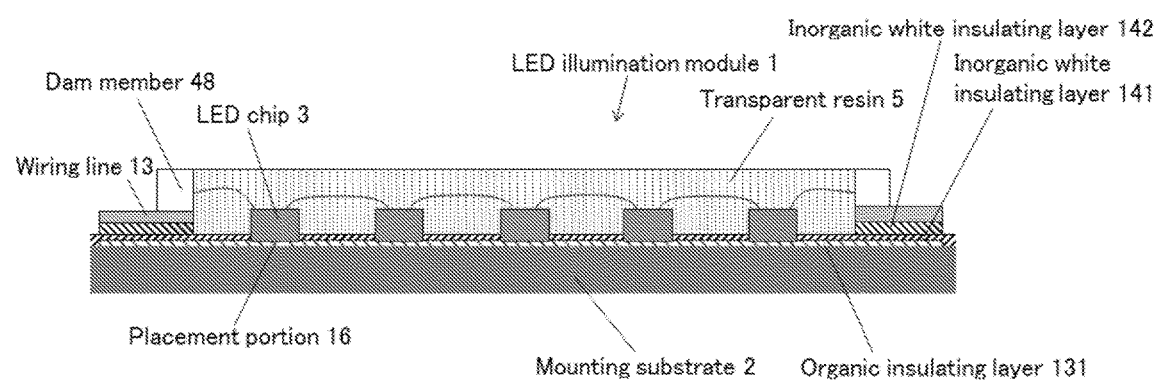
FIG. 17 is a side sectional view of an LED illumination module according to a ninth configuration example of the present invention.

FIG. 17 is a side sectional view illustrating a ninth configuration example of an LED illumination module 1 embodying the present invention.

The LED illumination module 1 according to the ninth configuration example is different from the module according to the sixth configuration example in that the white insulating layer is made up of an organic insulating layer 131 constituting a first layer, an inorganic white insulating layer 141 constituting a second layer, and an inorganic white insulating layer 142 constituting a third layer, that the inorganic white insulating layer 141 is wider than the organic insulating layer 131, and that a part of the inorganic white insulating layer 141 is laminated on the surface of the mounting substrate 2. It is disclosed here that the organic insulating layer 131 is formed, for example, by employing a polyamide-imide-based printing paste, which contain a polyamide-imide resin as a base material, and which is added with soluble resin filler (e.g., polyamide-imide-based filler). By employing the polyamide-imide-based printing paste disclosed here, a breakdown voltage of 230 V/μm can be realized.

According to the ninth configuration example, since the white insulating layer is partly constituted by the inexpensive organic insulating layer 131, the manufacturing cost can be reduced. On the other hand, since a part of the inorganic white insulating layer 141 is laminated on the surface of the mounting substrate 2, strong adhesion can be realized. Since the organic insulating layer 131 is covered with the inorganic white insulating layer 141, aged deterioration is also minimal.

While, in the this configuration example, the placement portion 16 in the form of a recess is provided in the inorganic white insulating layer 141 and the LED chip 3 is placed on the organic insulating layer 131 to increase the heat dissipation performance, the LED chip 3 may be placed on the inorganic white insulating layer 141 without providing the placement portion 16. In a design stage, due consideration is required regarding that the organic insulating layer 131 has a lower thermal conductivity than the inorganic white insulating layer 141.

Tenth Configuration Example

Figure 18:
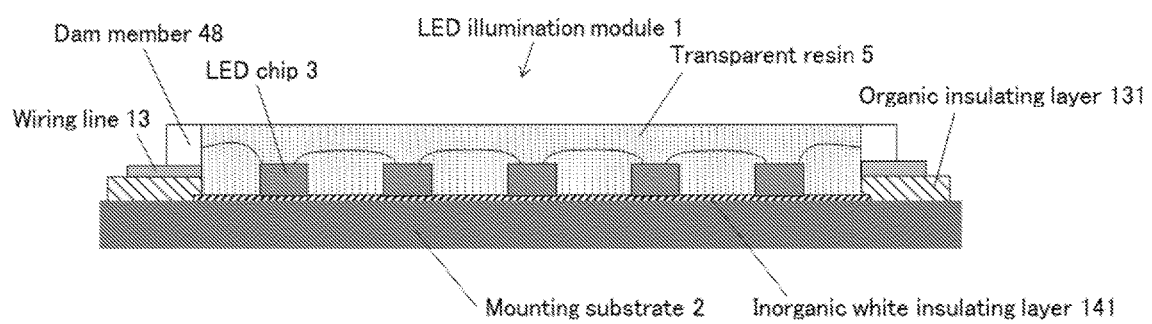
FIG. 18 is a side sectional view of an LED illumination module according to a tenth configuration example of the present invention.

FIG. 18 is a side sectional view illustrating a tenth configuration example of an LED illumination module 1 embodying the present invention.

In the mounting substrate 2 of the LED illumination module 1 according to the tenth configuration example, the reflection region surrounded by the dam member 48 is covered with the inorganic white insulating layer 141, and a region other than the reflection region is covered with the organic insulating layer 131. In this configuration example, the wiring lines 13 are formed on the organic insulating layer 131.

The LED illumination module 1 according to this configuration example is superior in reflectance, heat dissipation performance, and durability because the reflection region is covered with the inorganic white insulating layer 141. On the other hand, the manufacturing cost can be reduced by covering the region of the surface of the mounting substrate, in which the problem of heat does not occur, other than the reflection region with the organic insulating layer 131. Preferably, the surface of the organic insulating layer 131 is covered with a white solder resist layer (not illustrated in FIG. 18) such that a layer at the uppermost position functions as a reflection member.

Eleventh Configuration Example

FIG. 19 is a side sectional view illustrating an eleventh configuration example of an LED illumination module 1 embodying the present invention, and it is a sectional view taken along AA in FIG. 20(a) described later.

The LED chip 3 according to this configuration example is a vertically LED die in which an n-electrode on its upper surface is connected to a wiring line 13 by wire bonding, and a p-electrode at its bottom surface is connected to a wiring line 13 by, e.g., soldering. The white insulating layer is made up of the inorganic white insulating layer 141 and the inorganic white insulating layer 142. The inorganic white insulating layer 141 is applied wider and thinner than the inorganic white insulating layer 142, and the inorganic white insulating layer 142 is applied only over a necessary region to ensure a thickness required for reflection in that region.

FIG. 20(a) is a plan view of the LED illumination module according to the eleventh configuration example, and FIG. 20(b) is a sectional view taken along BB in FIG. 20(a).

In the LED illumination module 1 according to this configuration example, only a wiring region is covered with the inorganic white insulating layer 142. The wiring region is denoted by dotted lines in FIG. 20(a). In FIG. 20(a), the inorganic white insulating layer 142 is not formed in regions of certain widths from upper and lower ends, as viewed on the drawing sheet, of the mounting substrate 2 to reduce an amount of the used white inorganic ink. As a result, the manufacturing cost can be reduced.

Magnesium oxide or zinc oxide is used as the white inorganic pigment in the inorganic white insulating layer 141 constituting a first layer that is positioned on the side closer to the substrate, and titanium dioxide having a good reflectance is used as the white inorganic pigment in the inorganic white insulating layer 142 constituting a second layer that is positioned on the side closer to the outside. Alternatively, both the inorganic white insulating layer 141 and the inorganic white insulating layer 142 may contain the same white inorganic pigment.

This configuration example is merely illustrative, and it can be variously modified. For example, unlike this configuration example, the entire surface of the mounting substrate 2 may be covered with the inorganic white insulating layer 142. As an alternative, unlike this configuration example, the inorganic white insulating layer 141 in the region other than the reflection region may be replaced with an organic insulating layer. Furthermore, the LED chip 3 may be a horizontal LED that is flip-chip mounted.

Twelfth Configuration Example

FIG. 21 is a plan view of an LED illumination module 1 according to a twelfth configuration example of the present invention. In the LED illumination module 1 according to this configuration example, a number 81 of LED chips 3 are mounted at a high density in the reflection region formed on the upper surface of the mounting substrate 2.

All the number 81 of LED chips 3 have the same specifications, and they are connected in a wiring pattern of 9 in series×9 in parallel. Stated in another way, a light emitting section is constituted such that a unit LED chip group is made up of nine LED chips 3 connected to a pair of end electrodes, and that nine unit LED chip groups are connected in parallel. The pair of end electrodes are electrically connected to outer electrode terminals 18a and 18b by electrode units 17a and 17b, respectively, which include a pair of wiring portions disposed at the upper and lower ends, as viewed on the drawing sheet, of the reflection region. The nine LED chips constituting each unit LED chip group are arranged on a single linear line substantially at equal intervals, and the adjacent LED chips are connected to each other through a gold wire by wire bonding. The number of LED chips 3 and the number of unit LED chip groups are not limited to the illustrated numbers. The technical concept of this configuration example further involves an improved example in which a unit LED chip group made up of a number n of LED chips connected in series is arranged in number n in parallel. Thus, in this configuration example, the reflection region having substantially a square shape can be constituted by arranging a square number of LED chips in an array of n×n. Apart from this configuration example, the number of LED chips 3 is preferably 100 or more, more preferably 300 or more, even more preferably 500 or more, and further even more preferably 700 or more. In this connection, the shape of the mounting substrate 2 is rectangular, polygonal, or circular.

The number n×n of LED chips are mounted at a high density on the mounting substrate having a small area, thus constituting a light source with high brightness. The LED illumination module 1 according to this configuration example has external dimensions of 36 mm×36 mm×1 mm. The reflection region formed in the upper surface of the mounting substrate 2 has an area of 22.4 mm×22.4 mm=501.76 mm$^2$. In the reflection region, the number 81 of LED chips 3 are mounted at an array pitch of 2.28 mm in each of the series direction and the parallel direction. Each LED chip 3 has a chip size of 1.143 mm×1.143 mm×0.15 mm. The mounting area density (chip mounting area occupancy ratio) of the LED chips in the reflection region is 23.6 mm²/cm², and the mounting density is 16.1 number/cm². Here, the reflection region implies a region surrounded by the dam member 48.

With the LED illumination module 1 according to this configuration example, since the LED bare chips are COB-mounted, a thin light source can be realized.

The mounting substrate 2 is made of a material having good thermal conductivity and electrical characteristics, and it is constituted by, e.g., a copper plate or an aluminum plate. In the surface of the mounting substrate 2, at least the surface of the reflection region surrounded by the dam member 48 is covered with the inorganic white insulating layer 14. Preferably, the surface of the mounting substrate 2, which is positioned outside the dam member 48, is also covered with the inorganic white insulating layer 14. The inorganic white insulating layer 14 is formed in accordance with desired one selected from the configurations described above in the first to tenth configuration examples. Anyway, since the wiring line 13 in the twelfth configuration example is a single layer, the heat dissipation performance and the cost effectiveness are superior to the case where the wiring line is in the form of multiple layers.

In the LED illumination module 1 according to this configuration example, a forward current is 3.15 A, a forward voltage is 26.8 V, load electric power is 84.4 W, and overall light flux is 11190 lm. The color temperature is set in the range of 3000 K to 7000 K, and the color rendering property is Ra 65 to 90. In the LED illumination module 1 according to this configuration example, heat generated from the LED chip 3 is dissipated by being conducted to the heat sink 7 through, e.g., the heat spreader 10 that is in contact with the rear surface of the mounting substrate 2. Thus, as in the first configuration example, the LED illumination module 1 according to this configuration example is fixed to the module holder 9 through the heat spreader 10, thereby constituting the light source of the LED illumination apparatus (see FIG. 3), which includes the reflector 6, the heat sink 7, the diffusion plate 8, and the power supply device (not illustrated).

Thirteenth Configuration Example

FIG. 22 is a plan view of an LED illumination module 1 according to a thirteenth configuration example of the present invention. In the LED illumination module 1 according to this configuration example, a number 888 of LED chips 3 are mounted at a high density in the reflection region formed on the upper surface of the mounting substrate 2.

All the number 888 of LED chips 3 have the same specifications, and they are connected in a wiring patterns of 37 in series×24 in parallel. Stated in another way, a light emitting section is constituted such that a unit LED chip group is made up of thirty-seven LED chips 3 connected to a pair of end electrodes, and that twenty-four unit LED chip groups are connected in parallel. The pair of end electrodes are electrically connected to outer electrode terminals 18a and 18h by electrode units 17a and 17h, respectively, which include pairs of wiring portions disposed at the upper and lower ends, as viewed on the drawing sheet, of the reflection region. The thirty-seven LED chips constituting each unit LED chip group are arranged substantially at equal intervals, and the adjacent LED chips are connected to each other through a gold wire by wire bonding. In this configuration example, unlike the twelfth configuration example, the adjacent unit LED chip groups are arranged such that the LED chips 3 in the adjacent groups are positioned in a zigzag pattern. Furthermore, looking at each unit LED chip group, the thirty-seven LED chips are also positioned in a zigzag pattern. More specifically, in each unit LED chip group, the LED chips at odd number positions are arranged substantially at equal intervals on one linear line, and the LED chips at even number positions are arranged substantially at equal intervals on another linear line parallel to the one line on which the LED chips at odd number positions are arranged. The number of LED chips 3 and the number of unit LED chip groups are not limited to the illustrated numbers, but the number of LED chips constituting each unit LED chip group is required to be the same.

The number 888 of LED chips are mounted at a high density on the mounting substrate having a small area, thus constituting a light source with high brightness. The LED illumination module 1 according to this configuration example has external dimensions of 90 mm×90 mm×1 mm. The reflection region formed in the upper surface of the mounting substrate 2 has an area of 70.6 mm×70.6 mm=4984.36 mm². In the reflection region, the number 888 of LED chips 3 are mounted at an array pitch of 1.85 mm in the series direction and 1.4 mm in the parallel direction. Each LED chip 3 has a chip size of 1.143 mm×1.143 mm×0.15 mm. The mounting area density (chip mounting area occupancy ratio) of the LED chips in the reflection region is 23.2 mm²/cm², and the mounting density is 17.8 number/cm². Here, the reflection region implies a region surrounded by the dam member 48. A maximum rated current of the LED chip 3 is 700 mA. When a forward current is 350 mA, a forward voltage is 3.4 V and a light emitting output is 340 mW.

The mounting substrate 2 is made of a material having good thermal conductivity and electrical characteristics, and it is constituted by, e.g., a copper plate or an aluminum plate. In the surface of the mounting substrate 2, at least the surface of the reflection region surrounded by the dam member 48 is covered with the inorganic white insulating layer 14. Preferably, the surface of the mounting substrate 2, which is positioned outside the dam member 48, is also covered with the inorganic white insulating layer 14. The inorganic white insulating layer 14 is formed in accordance with desired one selected from the configurations described above in the first to tenth configuration examples. Anyway, since the wiring line 13 in the thirteenth configuration example is a single layer, the heat dissipation performance and the cost effectiveness are superior to the case where the wiring line is in the form of multiple layers.

In the LED illumination module 1 according to this configuration example, a forward current is 4.8 A, a forward voltage is 104 V, load electric power is 500 W, and overall light flux is 73600 Inn. The color temperature is set in the range of 3000 K to 7000 K, and the color rendering property is Ra 65 to 90.

In this configuration example, because the load electric power is as large as 500 W and the output of one universal power supply device is insufficient, four power supply devices are used in combination. More specifically, a light emitting section emitting a great amount of light can be constituted by arranging four mounting blocks 20a to 20d side by side, which are connected to the power supply devices in one-to-one relation. To eliminate fluctuations in illumination, preferably, the power supply devices have the same specifications, and they are connected to the mounting blocks under the same conditions. Here, the configuration of connecting the power supply devices and the mounting blocks under the same conditions involves not only the case where the number of mounting blocks and the number of power supply devices are the same, but also the case where a current supplied from one or more power supply devices, which are in smaller number than the mounting blocks, is branched into a plurality of mounting blocks under the same conditions. From the viewpoint of simplifying the configuration of a current control circuit, however, the number of mounting blocks is preferably set to be the same as the number of power supply devices that drive the LED chips to emit light. While the number of mounting blocks is set to four in this configuration example, the number of mounting blocks can be of course changed depending on the capacity of each power supply device used. For example, 100,000 lumens or more can be realized with three mounting blocks by employing a power supply device of 300 W instead of a power supply device of 180 W.

From the viewpoint of employing a universal constant-current power supply device with a maximum output capacity of 200 W or less, the number of mounting blocks is set to preferably 2 to 8 and more preferably 3 to 6. As a preferred configuration example, it is disclosed here to set the number of LED chips per mounting block to 100 to 300, thus constituting a module in which the LED chips are mounted in total number 400 to 1200.

In this configuration example, one mounting block is constituted by a number 222 of LED chips 3 that are connected to a pair of electrode units (e.g., 17a and 17b) and a pair of outer electrode terminals (e.g., 18a and 18b). Each mounting block is constituted such that the electrode units 17, the outer electrode terminals 18, and the LED chips 3 are positioned in line symmetrical relation with respect to a cross-sectional center line 23.

The mounting blocks 20a and 20b and the mounting blocks 20c and 20d are arranged in line symmetrical relation with respect to a separation line 21. In more detail, the electrode units 17a to 17h, the outer electrode terminals 18a to 18h, protective diode devices 19a to 19d, and the mounting blocks 20a to 20d are arranged in line symmetrical relation with respect to the separation line 21 such that respective total resistances of the mounting blocks are substantially the same and fluctuations in illumination will not occur.

In this configuration example, the mounting block 20a and the mounting block 20b are also positioned in line symmetrical relation to constitute paired mounting blocks, and the mounting block 20c and the mounting block 20d are further positioned in line symmetrical relation to constitute paired mounting blocks. A separation line is arranged between the two paired mounting blocks adjacent to each other. When the number of mounting blocks is 2, the separation line is not necessary because two protective diode devices may be arranged at right and left both ends of the reflection region. When an even number of mounting blocks are disposed, the number of separation lines is given as a number obtained by subtracting 1 from the number that is resulted from dividing the number of mounting blocks by 2. For example, when the number of mounting blocks is 6, the number of separation lines is 2. When the number of mounting blocks is 8, the number of separation lines is 3.

The protective diode device 19 is a backflow preventing device that electrically connects a pair of electrode units (e.g., 17a and 17b) constituting the paired units. Upon exertion of a backward voltage between the pair of electrode units, the protective diode device 19 prevents the backward voltage from being applied to the LED chip group and from damaging it. FIG. 23 illustrates a configuration of the protection diode device 19a connecting the pair of electrode units 17a and 17b. The protective diode device 19a is constituted by connecting six Zener diodes 22 in series, which are arranged substantially at equal intervals. Each Zener diode 22 has external dimensions of, e.g., 258 μm×258 μm×150 μm. The protective diode devices 19b to 19d also have the same configuration as that of the protective diode device 19a.

As in the twelfth configuration example, the LED illumination module 1 according to this configuration example is fixed to the module holder 9 through the heat spreader 10, thereby constituting the light source of the LED illumination apparatus (see FIG. 3), which includes the reflector 6, the heat sink 7, the diffusion plate 8, and the power supply device (not illustrated).

With the technical concept of the present invention derived from the above-described practical examples, it is possible to realize not only an LED illumination apparatus (except for a power supply device), which has high brightness, emits a great amount of light with the overall light flux being 30,000 lumens or more, and has weight of 10 kg or less while the mounting substrate has dimensions of 100 mm×100 mm or less when looked at in a plan view, but also an LED illumination apparatus that has high brightness and emits a great amount of light at 40,000 lumens or more, 50,000 lumens or more, 60,000 lumens or more, 70,000 lumens or more, or 80,000 lumens or more.

While several embodiments have been fully described for merely illustrative purpose in the above disclosure, the embodiments can be variously modified without substantially departing from the novel teaching and the advantageous effects according to the concept of the present invention.

LIST OF REFERENCE SYMBOLS

1 LED illumination module
2 mounting substrate
3 LED chip (LED bare chip)
5 transparent resin
6 reflector
7 heat sink
8 diffusion plate
9 module holder
10 heat spreader
11 protective cover
12 O ring
13 wiring line
14 inorganic white insulating layer
16 placement portion
17 electrode unit
18 outer electrode terminal
19 protective diode device
20 mounting block
21 separation line
22 Zener diode
23 cross-sectional center line
30 organic insulating layer
47 projected placement portion
48 dam member
49 reflection region
50 metal thin film layer
131 organic insulating layer
141 to 143 inorganic white insulating layers

The invention claimed is:

1. An LED illumination module in which a plurality of LED bare chips are mounted on a mounting substrate at a high density, the module comprising:
   each of the plurality of the LED bare chips having identical specifications;

the mounting substrate at least a surface of which is metal; and a reflection region in which the LED bare chips are sealed off with resin, wherein a surface of the reflection region of the mounting substrate is covered with an inorganic white insulating layer that functions as a reflection member, at least a part of the inorganic white insulating layer constituting a multilayer structure in combination with a metal layer, a plurality of unit LED chip groups including at least one of the plurality of LED bare chips connected in series, the plural unit LED chip groups being connected in parallel, and overall light flux is 10,000 lumens or more, and a mounting area occupancy ratio of the LED bare chips (A) to the reflection region (B) satisfies (A)/(B)=0.15 or more.

2. The LED illumination module according to claim 1, wherein the inorganic white insulating layer includes an inorganic white insulating layer that is formed by applying a liquid material, which contains white inorganic pigment and $SiO_2$ in form of nanoparticles, to the surface of the mounting substrate, and heating the applied liquid material at 160 to 200° C.

3. The LED illumination module according to claim 1, wherein the surface of the mounting substrate is copper.

4. The LED illumination module according to claim 1, wherein the module includes a plurality of mounting blocks in which the many LED bare chips are mounted in equally divided number, and each of the mounting blocks includes a plurality of unit LED chip groups, and a pair of electrode units to which the plural unit LED chip groups are connected in parallel.

5. The LED illumination module according to claim 4, wherein each of the mounting blocks includes a protective diode that connects the pair of electrode units.

6. The LED illumination module according to claim 5, wherein the plural mounting blocks are constituted by an even number of mounting blocks made up of paired mounting blocks that are arranged in line symmetrical relation.

7. The LED illumination module according to claim 6, wherein the plural mounting blocks are three or more mounting blocks, and a separation line is disposed between the mounting blocks adjacent to each other.

8. The LED illumination module according to claim 1, wherein the unit LED chip group includes a number n (n is an integer of 8 or more) of LED bare chips, and the many LED bare chips are arranged in an array of n rows×n columns.

9. The LED illumination module according to claim 1, wherein the many LED bare chips are a number 300 or more of LED bare chips, and overall light flux is 30,000 lumens or more.

10. The LED illumination module according to claim 9, wherein the LED bare chips are each a LED bare chip in class having a maximum rated current of 100 mA or more.

11. The LED illumination module according to claim 9, wherein brightness in the reflection region is 7.0 [lm/mm$^2$] or more.

12. The LED illumination module according to claim 9, wherein an area of the mounting substrate is 5,000 mm$^2$ or more and 20,000 mm$^2$ or less.

13. The LED illumination module according to claim 1, wherein a placement portion in which the metal surface is exposed is formed at a position where the LED bare chip is placed.

14. The LED illumination module according to claim 1, wherein wiring lines are formed on the inorganic white insulating layer.

15. The LED illumination module according to claim 1, wherein the inorganic white insulating layer includes a first inorganic white insulating layer laminated on the mounting substrate, and a second inorganic white insulating layer laminated on the first inorganic white insulating layer.

16. The LED illumination module according to claim 15, wherein white inorganic pigment contained in the first inorganic white insulating layer has a higher thermal conductivity than white inorganic pigment contained in the second inorganic white insulating layer.

17. The LED illumination module according to claim 15, wherein a recessed LED placement portion in which the first inorganic white insulating layer is exposed is formed in the second inorganic white insulating layer.

18. The LED illumination module according to claim 1, further comprising an organic insulating layer that constitutes a layer positioned under the inorganic white insulating layer.

19. The LED illumination module according to claim 1, further comprising an organic insulating layer that covers a surface of a region of the mounting substrate outside the reflection region.

20. An LED illumination apparatus comprising:
the LED illumination module according to claim 1;
a reflector;
a heat spreader;
a heat sink; and
a power supply device.

21. An LED illumination apparatus comprising:
the LED illumination module according to claim 4;
a reflector;
a heat spreader;
a heat sink; and
a plurality of power supply devices,
wherein the number of power supply devices and the number of mounting blocks are equal.

22. The LED illumination apparatus according to claim 20, wherein weight of the LED illumination apparatus except for the power supply devices is 15 kg or less.

* * * * *